(12) United States Patent
Chou et al.

(10) Patent No.: US 9,478,287 B2
(45) Date of Patent: Oct. 25, 2016

(54) CIRCUITS AND METHODS FOR DETECTING WRITE OPERATION IN RESISTIVE RANDOM ACCESS MEMORY (RRAM) CELLS

(71) Applicant: Taiwan Semiconductor Manufacturing Company Limited, Hsinchu (TW)

(72) Inventors: Chung-Cheng Chou, Hsin-Chu (TW); Yi-Chun Shih, Taipei (TW); Po-Hao Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/608,260

(22) Filed: Jan. 29, 2015

(65) Prior Publication Data
US 2016/0225443 A1 Aug. 4, 2016

(51) Int. Cl.
*G11C 13/00* (2006.01)

(52) U.S. Cl.
CPC ....... *G11C 13/0064* (2013.01); *G11C 13/0002* (2013.01); *G11C 13/0069* (2013.01); *G11C 2013/0045* (2013.01)

(58) Field of Classification Search
CPC .................. G11C 2013/0045; G11C 13/0064
USPC ..................................................... 365/189.11
See application file for complete search history.

(56) References Cited

U.S. PATENT DOCUMENTS

| | | | | |
|---|---|---|---|---|
| 5,764,178 A | * | 6/1998 | Kim | G11C 7/22 327/141 |
| 6,477,090 B2 | * | 11/2002 | Yamaki | G11C 11/5628 365/185.21 |

* cited by examiner

*Primary Examiner* — Hoai V Ho
*Assistant Examiner* — Jay Radke
(74) *Attorney, Agent, or Firm* — Jones Day

(57) ABSTRACT

Circuits and methods for detecting write operation and limiting cell current in resistive random access memory (RRAM or ReRAM) cells are provided. RRAM cells can include a select transistor and a programmable resistor. Current can flow through the programmable resistor responsive to word line voltage $V_{WL}$ applied to the gate of the select transistor and a bit line voltage $V_{BL}$ applied to the source of the select transistor. Responsive to the current, the programmable resistor can change between relatively high and low resistances ("SET"), or between relatively low and high resistances ("RESET"). It can be desirable to accurately characterize the resistance of the programmable resistor, that is, to accurately detect write operations such as SET or RESET. Additionally, it can be undesirable for the current to exceed a certain value ("over-SET"). The present circuits and methods can facilitate detecting write operations or limiting current, or both, in an RRAM cell.

19 Claims, 12 Drawing Sheets

CIRCUITS AND METHODS FOR DETECTING WRITE OPERATION IN RESISTIVE RANDOM ACCESS MEMORY (RRAM) CELLS

BACKGROUND

This application generally relates to resistive random access memory, which can be referred to as RRAM or ReRAM.

RRAM cells can include a select transistor and a programmable resistor. Current can flow through the programmable resistor responsive to a word line voltage VWL applied to the gate of the select transistor and a bit line voltage VBL applied to the source of the select transistor. Responsive to the current, the programmable resistor can change between a relatively high resistance and a relatively low resistance, which can be referred to as a "SET" operation; or between the relatively low resistance and the relatively high resistance, which can be referred to as a "RESET" operation. However, it can be difficult to accurately characterize the resistance of the programmable resistor, that is, to accurately detect write operations such as SET or RESET in an RRAM cell. Additionally, it can be undesirable for the current to exceed a certain value, which can cause the resistance of the programmable resistor to drop below the relatively low resistance. Such a condition can be referred to as "over-SET."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
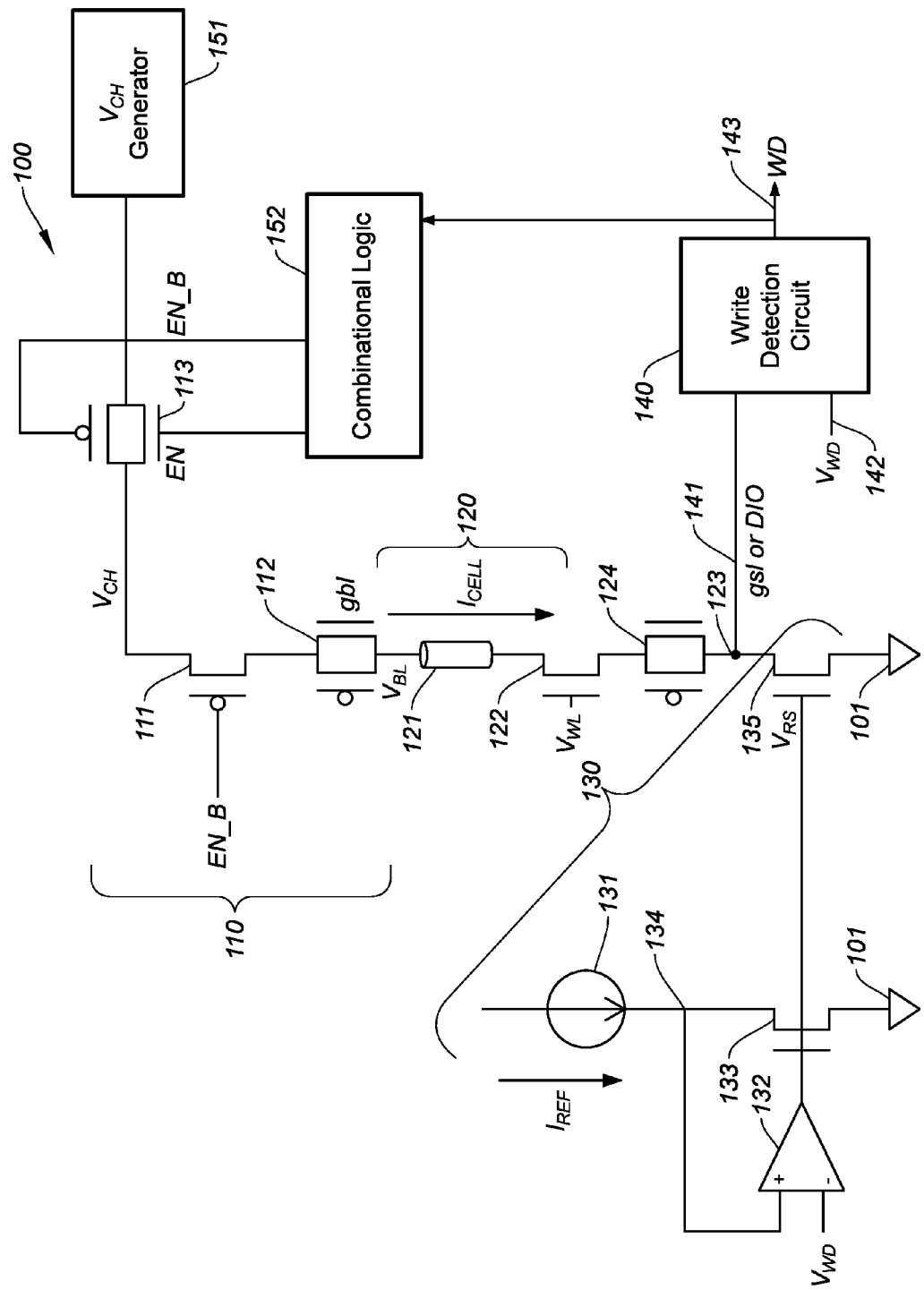
FIG. 1 illustrates a memory cell including a write detection circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present invention provide circuits and methods for detecting write operation in resistive random access memory (RRAM or ReRAM) cells. For example, as noted above, RRAM cells can include a select transistor and a programmable resistor. Current can flow through the programmable resistor responsive to word line voltage $V_{WL}$ applied to the gate of the select transistor and a bit line voltage $V_{BL}$ applied to the source of the select transistor. Responsive to the current, the programmable resistor can change between a relatively high resistance and a relatively low resistance, which can be referred to as a "SET" operation, or between the relatively low resistance and the relatively high resistance, which can be referred to as a "RESET" operation. It can be desirable to accurately characterize the resistance of the programmable resistor, that is, to accurately detect write operations such as SET or RESET in an RRAM cell. Additionally, it can be undesirable for the current to exceed a certain value, which can cause the resistance of the programmable resistor to drop below the relatively low resistance. Such a condition can be referred to as "over-SET." The present circuits and methods can facilitate detecting write operations in an RRAM cell.

FIG. 1 illustrates a memory cell 100 including a write detection circuit, in accordance with some embodiments. Memory cell 100 includes bit line selection circuitry 110, resistive random access memory (RRAM or ReRAM) cell 120, current limiter 130, and write detection circuit 140. RRAM cell 120 is coupled to each of bit line selection circuitry 110, current limiter 130, and write detection circuit 140.

In the illustrated embodiment, bit line selection circuitry 110 includes bit line transistor 111, first column multiplexer (MUX) 112, e.g., a PMOS and NMOS column MUX, and second column MUX 113, e.g., a PMOS and NMOS column MUX. Bit line transistor 111 includes a source receiving channel voltage $V_{CH}$ from second column MUX 112, a gate receiving voltage EN_B, and a drain coupled to second column MUX 112. I/O circuitry (not specifically illustrated) suitably can select the values of $V_{CH}$, EN_B, gbl, and gsl so as to apply bit line voltage $V_{BL}$ to RRAM cell 120. In one illustrative embodiment, $V_{CH}$ is generated by $V_{CH}$ generator 151, such as a low-dropout regulator (LDO), and is transmitted to the source of bit line transistor 111 via second column MUX 113 which is in operable communication with combinatorial logic 152. Note that alternative circuits for applying $V_{BL}$ to RRAM cell 120 suitably can be used.

In some embodiments, $V_{CH}$ can be at a voltage level to provide sufficient energy or electric field to migrate oxygen atoms and enable SET or RESET processes. The voltage levels of $V_{CH}$ for SET and RESET can be different than one another. In one nonlimiting example, $V_{CH}$ can be approximately equal to 1.6 V for a SET operation, or can be approximately equal to 2 V for a RESET operation. In some embodiments, EN_B can be can be a logic signal, illustrative either 0 V or $V_{DD}$ (e.g., 2.5 V) to switch on or off bit line transistor 111. In some embodiments, gbl denotes the global bit-line and gsl denotes the global source-line. Both gbl and gsl can be the connections from a write driver (not illustrated) to memory cell 100, as well as to other memory cells of a cell array, e.g., such as described further below with reference to FIG. 11.

Note that FIG. 1 illustrates an exemplary electrical connection for a write path that includes $V_{CH}$ (which can be an LDO output, as noted above) through bit line transistor 111 and connects to first column MUX 112. In one illustrative embodiment, first MUX 112 includes a multiple pass-gate that is connected between the bit line transistor 111 and resistive random access memory (RRAM) cell 120 of each of a plurality of memory cells 100 of an array, although only a single pass-gate is illustrated in FIG. 1. A local bit line can be connected with each such cell of an array, and can connect the cells of the array via gbl. After MUX 112, the write path goes to RRAM cell 120 (described further below) that is connected between first column MUX 112 and a third column MUX 124, e.g., a PMOS and NMOS column MUX, to which gsl can be applied. The connection between RRAM cell 120 and first column MUX 112 can define a local bitline. Additionally, note that the voltage levels of gbl and gsl illustratively can be at the same voltage as $V_{CH}$ or as $V_{SS}$ (e.g., ground) and can have opposite polarity to one another during the write process. Additionally, note that in standby mode, in which write detection is not being performed, both gbl and gsl can be tied to the same bias as one another, e.g., both can be grounded.

Resistive random access memory (RRAM) cell 120 illustrated in FIG. 1 includes select transistor 122 and programmable resistor 121. The programmable resistor 121 can be configured to change between a relatively high resistance and a relatively low resistance responsive to changes in cell current through the RRAM cell 120, and a dynamic voltage DIO can be based on the resistance of programmable resistor 121. For example, a gate of select transistor 122 can receive a word line voltage $V_{WL}$ from the I/O circuitry. A source of select transistor 122 receives a bit line voltage $V_{BL}$ from the I/O circuitry. A drain of select transistor 122 is coupled to third column MUX 124 which receives gsl (global source line), e.g., such as described in greater detail below with reference to FIG. 11. In one exemplary embodiment, select transistor 122 includes an NMOS transistor. Programmable resistor 121 is coupled to the source or the drain of select transistor 122. For example, in the embodiment illustrated in FIG. 1, programmable resistor 121 is coupled between MUX 112 and select transistor 122, and the drain of select transistor 122 is coupled to third column MUX 124. Alternatively, in a "reverse" configuration, select transistor 122 can be coupled between MUX 112 and programmable resistor 121, and programmable resistor 121 can be coupled to third column MUX 124. Programmable resistor 121 is configured to change between a relatively high resistance and a relatively low resistance responsive to changes in a cell current $I_{CELL}$ through the RRAM cell based upon values of $V_{BL}$ and $V_{WL}$. In one nonlimiting example, the relatively low resistance is approximately 5 kΩ, and the relatively high resistance is approximately 50 kΩ. However, it should be appreciated that other resistances suitably can be used. A dynamic voltage DIO at node 123 is based on the resistance of the programmable resistor of the RRAM cell. DIO can be relatively small, e.g., can have a value of approximately 0 mV and approximately 100 mV in one nonlimiting example. A drain of select transistor 122 is coupled, directly or indirectly, to ground 101. For example, in the embodiment of FIG. 1, the drain of select transistor 122 is coupled to ground 101 via third column MUX 124, node 123, and second NMOS transistor 135 of current limiter 130; in a "reverse" embodiment, the drain of select transistor can be coupled to ground 101 via programmable resistor 121, third column MUX 124, node 123, and second NMOS transistor 135 of current limiter 130.

In some embodiments, memory cell 100 includes current limiter 130. In the illustrated embodiment, current limiter 130 includes current source 131, operational amplifier 132, first NMOS transistor 133, and second NMOS transistor 135. Current source 131 is configured to generate a reference current $I_{REF}$ for use in applying an appropriate bias to select transistor 122. For example, current source 131 can be coupled to a first input of operational amplifier 132, and also to the source of first NMOS transistor 133, via node 134. A second input of operational amplifier 132 can receive a write detection reference voltage $V_{WD}$ from the I/O circuitry, where $V_{WD}$ is selected so as to be approximately equal to the maximum value of DIO, e.g., so as to be approximately equal to 100 mV in one nonlimiting example. An output of operational amplifier 132 respectively can be coupled to the gates of first and second NMOS transistors 133, 135. Additionally, the drains of first and second NMOS transistors 133, 135 can be coupled to ground 101.

Figure 5:
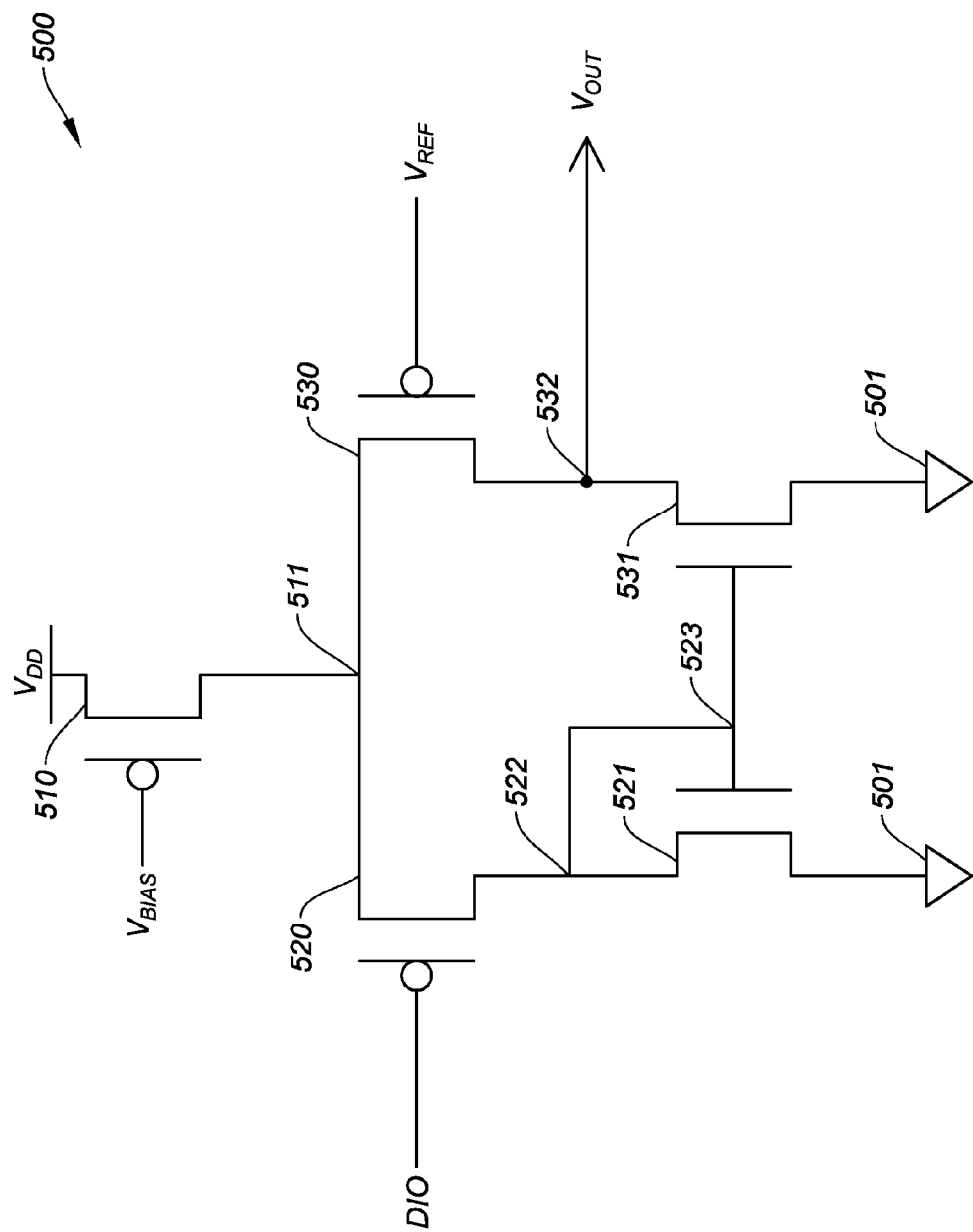
FIG. 5 illustrates a comparative operational amplifier.

During operation, first and second NMOS transistors 133, 135 act as an active resistive sensor, and a resistive sensor voltage $V_{RS}$ of the coupled gates of first and second NMOS transistors 133, 135—and accordingly, the values of $I_{CELL}$ and DIO—can be based on the values of $I_{REF}$, $I_{CELL}$, $V_{WD}$, and $V_{WL}$. For example, based upon $I_{CELL}$ being approximately equal to $I_{REF}$, DIO is approximately equal to $V_{WD}$, which can appropriately bias first NMOS transistor 133 and second NMOS transistor 135 so as to limit current through RRAM cell 120. $V_{RS}$ can provide a bias that causes second NMOS transistor 135 to behave as a resistor, and to make voltage DIO reach $V_{WD}$ when second NMOS transistor is approaching the saturation limit and can limit current, which can limit the current flowing through programmable resistor 121. Such current limiting can help to protect programmable resistor 121 from over stress, e.g., because write detection circuit 140 can require time to respond to DIO approaching $V_{WD}$. Before WD flips and turns off the write driver (not specifically illustrated), such current limiting can help to inhibit programmable resistor 121 from an over SET or an over RESET condition. Additionally, second NMOS transistor 135 can act as a current sink, thus at least partially limiting cell current $I_{CELL}$ to a value approximately equal to $I_{REF}$; however, as described in greater detail below with reference to FIG. 6, second NMOS transistor 135 may not necessarily be able to fully limit cell current $I_{CELL}$ to a value approximately equal to $I_{REF}$, for example, if comparative operational amplifier 500 illustrated in FIG. 5 is coupled to node 123 instead of the present write detection circuit 140 illustrated in FIG. 2 or the alternative write detection circuit 140' illustrated in FIG. 10. Note that alternative current limiting circuits suitably can be used.

Memory cell 100 also can include write detection circuit 140. In the illustrated embodiment, write detection circuit 140 can include a first input 141 coupled to node 123 from which the write detection circuit receives DIO, a second input 142 coupled to the I/O circuitry from which the write detection circuit receives $V_{WD}$, and can include output 143 at which the write detection circuit outputs write detection voltage WD. In one nonlimiting embodiment, write detection circuit 140 can include a voltage shifting circuit receiving DIO and including a first node at a voltage of approximately $V_{DD}/2$, where $V_{DD}$ is a supply voltage, and a second node at an input voltage $V_{IN}$ having a value of approximately $V_{DD}/2$–DIO. Write detection circuit also can include an inverter comparator circuit that includes a master circuit and a slave circuit. The master circuit can include a third node coupled to the voltage shifting circuit, and a fourth node being at voltage $V_{BIAS}$. The slave circuit can include a fifth node coupled to the second node, a sixth node coupled to the fourth node, and a seventh node having a write detection voltage WD based on the input voltage $V_{IN}$ and the bias voltage $V_{BIAS}$.

Combinational logic 152 can include logic, such as an inverter, to generate a complementary logic signal to turn on or off MUX 113 (pass gate), and thus to start or stop write operation, responsive to the value of WD. For example, combinational logic 152 can include circuitry that, responsive to the value of WD, respectively applies appropriate signals EN and EN_B, which can be logical inverses of one another, to pass gates of MUX 113 so as to inhibit MUX 113 from passing $V_{CH}$ to bit line selection circuitry 110 and thus to inhibit application of $I_{CELL}$ to RRAM cell 120.

As noted above, dynamic voltage DIO can be relatively small, e.g., can have a value of approximately 0 mV and approximately 100 mV in one nonlimiting example. It can be relatively difficult to detect write operations based on such relatively small voltage changes using a conventional operational amplifier, which can be configured to detect voltage changes about voltages greater than 1 V, although the voltage level can depend on the $V_{DD}$ level and technology node. For example, a conventional operational amplifier can operate well around the middle of $V_{DD}$, so as to provide the operational amplifier with sufficient headroom. Additionally, if $V_{WD}$ is sufficiently high as to erode drain-to-source-voltage across select transistor 122, then the reliability of write operations to RRAM cell 120 can be degraded. Accordingly, it can be useful to voltage shift the value of DIO to a higher level at which changes in DIO can more readily be detected, which can reduce the value of $V_{WD}$ that may be needed to detect write operation and thus increase reliability of write operations to RRAM cell 120.

Figure 2:
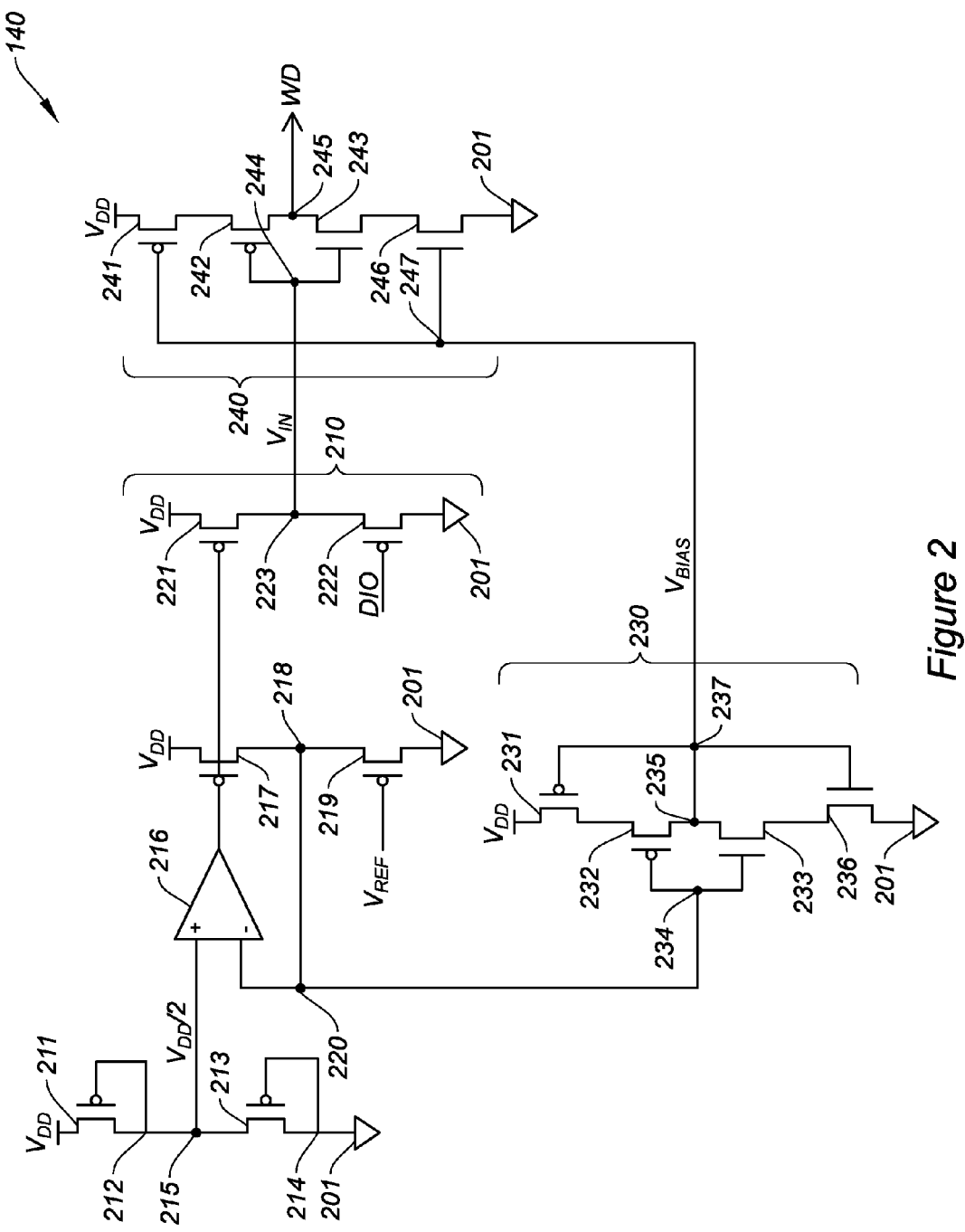
FIG. 2 illustrates a write detection circuit, in accordance with some embodiments.

FIG. 2 illustrates further detail of write detection circuit 140, in accordance with some embodiments. In the illustrated embodiment, write detection circuit 140 includes voltage shifting circuit 210 as well as an inverter comparator circuit that includes master circuit 230 and slave circuit 240. Voltage shifting circuit 210 can be configured to receive a dynamic voltage and a first voltage and to provide as output a second voltage approximately equal to the first voltage divided by approximately two, minus the dynamic voltage. The master circuit can be coupled to the voltage shifting circuit and can be configured to provide as output a first bias voltage. The slave circuit can be coupled to the voltage shifting circuit and to the master circuit and can be configured to provide as output a write detection voltage based on the second voltage and the first bias voltage. Voltage shifting circuit 210 can include a first circuit configured to receive the first voltage and can be coupled to a ground and configured to output the second voltage. Voltage shifting circuit 210 also can include an operational amplifier including a first input, a second input, and an output. The first input can be coupled to the first circuit and configured to receive the second voltage therefrom. The operational amplifier can output at the output a second bias voltage. Voltage shifting circuit 210 also can include a second circuit coupled to the second input and the output of the operational amplifier and configured to receive the second bias voltage and a reference voltage. Voltage shifting circuit 210 also can include a third circuit coupled to the second circuit and to the output of the operational amplifier and configured to receive the second bias voltage and the dynamic voltage and to provide as output the second voltage. In some embodiments, the slave circuit includes a fourth circuit coupled to the third circuit and configured to receive the second voltage therefrom. The fourth circuit also can be coupled to the master circuit and configured to receive the first bias voltage therefrom, and can be configured to provide as output the write detection voltage. In some embodiments, the master circuit includes a fifth circuit being coupled to the second input of the operational amplifier and to the second circuit and to the fourth circuit and configured to output the first bias voltage to the fourth circuit.

For example, in the embodiment illustrated in FIG. 2, voltage shifting circuit 210 receives DIO, e.g., at the gate of PMOS transistor 222. Voltage shifting circuit 210 also includes first node 215 at a voltage of approximately $V_{DD}/2$, where $V_{DD}$ is a supply voltage, and second node 223 at an input voltage $V_{IN}$ having a value of approximately $V_{DD}/2$–DIO. Master circuit 230 of the inverter comparator can include a third node 234 coupled to voltage shifting circuit 210, and a fourth node 237 being at voltage $V_{BIAS}$. Slave circuit 240 can include fifth node 244 coupled to second node 223, sixth node 247 coupled to fourth node 237, and seventh node 243 having a write detection voltage WD based on the input voltage $V_{IN}$ and the bias voltage $V_{BIAS}$. It should be appreciated that voltage shifting circuit 210 and the inverter comparator circuit that includes master circuit 230 and slave circuit 240 can be configured differently, and connected differently to one another, than is shown in FIG. 2.

In the particular embodiment illustrated in FIG. 2, voltage shifting circuit 210 includes first PMOS transistor 211, second PMOS transistor 213, operational amplifier 216, third PMOS transistor 217, and fourth PMOS transistor 219. First PMOS transistor 211 includes a source coupled to supply voltage $V_{DD}$, and a gate and a drain coupled to one another at eighth node 212. Second PMOS transistor 213 includes a source coupled to first node 215, and a gate and a drain coupled to one another at ninth node 214. The drain of second PMOS transistor 213 also is coupled to ground 201. Operational amplifier 216 includes a first input, a second input, and an output. The first input is coupled to first node 215 and receives from first node 215 a voltage approximately equal to $V_{DD}/2$. First and second PMOS transistors 211, 213 can provide a cascade structure so as to generate $V_{DD}/2$. For example, current flow through first and second PMOS transistors 211, 213 can be the same. Additionally, first and second PMOS transistors 211, 213 can be referred to as "diode-connected," meaning that first and second PMOS transistors 211, 213 can act as a diode. Injecting a current through first PMOS transistor 211 can cause a corresponding voltage ($V_{DS,211}$) cross between the drain and source of that transistor, and injecting a current through second PMOS transistor 213 can cause a corresponding voltage ($V_{DS,213}$) cross between the drain and source of that transistor. Based upon first PMOS transistor 211 and second PMOS transistor 213 having approximately the same width and length as one another, $V_{DS,211} = V_{DS,213} = V_{DD}/2$.

Third PMOS transistor 217 includes a source coupled to the supply voltage $V_{DD}$, a gate coupled to the output of operational amplifier 216, and a drain coupled to the second input of operational amplifier 216 via tenth node 218. Fourth PMOS transistor 219 includes a source coupled to tenth node 218, a gate receiving reference voltage $V_{REF}$, and a drain coupled to ground 201. Fifth PMOS transistor 221 includes a source coupled to the supply voltage $V_{DD}$, a gate coupled to the gate of third PMOS transistor 217, and a drain coupled to second node 223. Sixth PMOS transistor 222 includes a source coupled to second node 223, a gate receiving DIO, e.g., from node 123 illustrated in FIG. 1, and a drain coupled to ground 201. Based on the operation of the components of voltage shifting circuit 210, input voltage $V_{IN}$ at second node 223 can have a value of approximately $V_{DD}/2$–DIO. A value of DIO can vary between approximately 0 mV and approximately $V_{REF}$. $V_{REF}$ can be selected based on the anticipated maximum value of DIO under normal operating conditions, e.g., can be equal to 100 mV or less in one nonlimiting example.

In some embodiments, third PMOS transistor 217 and fifth PMOS transistor 221 have approximately the same width and length as one another, and fourth PMOS transistor 219 and sixth PMOS transistor 222 having approximately the same width and length as one another. Additionally, in some embodiments, the gain of operational amplifier 216 is sufficiently large that the voltage at twelfth node 220 (or tenth node 218) can be the same or approximately the same as at node 215, e.g., approximately equal to $V_{DD}/2$. The output of operational amplifier 216 can dynamically adjust the voltage applied to the gate of third PMOS transistor 217, which can make the voltage at twelfth node 220 (or tenth node 218) approximately equal to $V_{DD}/2$. In some embodiments, $V_{REF}$ is a fixed voltage, illustratively 100 mV although any other suitable voltage can be used. Third PMOS transistor 217 and fourth PMOS transistor 219 can be considered to define a first branch, and fifth PMOS transistor 221 and sixth PMOS transistor 222 can be considered to define a second branch that is substantially a replica of the first branch. Additionally, third PMOS transistor 217 and fifth PMOS transistor 221 have the same gate bias as one another as generated by operational amplifier 216. Accordingly, changes in the dynamic value of DIO can cause changes in the value of the output voltage $V_{IN}$ at second node 223. For example, if DIO is smaller than $V_{REF}$, then $V_{IN}$ can be smaller than $V_{DD}/2$. If DIO is exactly equal to $V_{REF}$, then $V_{IN}$ can be equal to $V_{DD}/2$. If DIO is larger than $V_{REF}$, then $V_{IN}$ can be larger than $V_{DD}/2$. In FIG. 2, because it is desired to detect DIO, when current flows through RRAM cell 120 (such as illustrated in FIG. 1), $V_{IN}$ follows DIO but is amplified. Accordingly, $V_{IN}$ can be swept between a range of values up to $V_{DD}/2$. Additionally, note that elements 216, 217, and 220 can form a closed loop that self-adjusts to the bias, such that the voltage at node 218 follows the level of $V_{DD}/2$, causing $V_{IN}$ to go to $V_{DD}/2$.

It should be appreciated that other circuits for generating voltage $V_{IN}$ suitably can be included within write detection circuit 140.

In the embodiment illustrated in FIG. 2, slave circuit 240 includes seventh PMOS transistor 241 including a source coupled to the supply voltage $V_{DD}$, and a gate coupled to sixth node 247. Slave circuit 240 also includes eighth PMOS transistor 242 including a source coupled to the drain of seventh PMOS transistor 241, and a drain coupled to seventh node 245. Slave circuit 240 also includes seventh NMOS transistor 246 including a gate coupled to sixth node 247 and a drain coupled to ground 201. Slave circuit 240 also includes eighth NMOS transistor 243 including a drain coupled to the source of seventh NMOS transistor 246, a gate coupled to fifth node 244, and a source coupled to seventh node 245. Based on the values of $V_{BIAS}$ at sixth node 247 and $V_{IN}$ at fifth node 244, the components of slave circuit generate an output WD at seventh node 245 indicative of write operation. In one nonlimiting example, WD can be high based on the input voltage $V_{IN}$ being equal to or exceeding the bias voltage $V_{BIAS}$, e.g., based on DIO being relatively high based on programmable resistor 121 illustrated in FIG. 1 having a relatively high resistance. In another nonlimiting example, WD can be low based on the input voltage $V_{IN}$ being less than the bias voltage $V_{BIAS}$, e.g., based on DIO being relatively low based on programmable resistor 121 illustrated in FIG. 1 having a relatively low resistance. Accordingly, as programmable resistor 121 transitions between the relatively high resistance and the relatively low resistance based on SET and RESET operations, the value of WD can transition between high and low and thus accurately can represent write operations in memory cell 100.

Additionally, in the embodiment illustrated in FIG. 2, master circuit 230 includes ninth PMOS transistor 232 including a gate coupled to third node 234 and a drain coupled to eleventh node 235. Master circuit 230 also includes tenth PMOS transistor 231 including a source coupled to the supply voltage $V_{DD}$, a drain coupled to the source of ninth PMOS transistor 232, and a gate coupled to fourth node 237. Master circuit 230 also includes ninth NMOS transistor 233 including a gate coupled to third node 234, and a source coupled to eleventh node 235. Master circuit 230 also includes tenth NMOS transistor 236 including a source coupled to the drain of ninth NMOS transistor 233, a drain coupled to ground 201, and a gate coupled to fourth node 237. Fourth node 237 is coupled to sixth node 247 and to eleventh node 235. Master circuit 230 also includes twelfth node 220 to which third node 234, the second input of operational amplifier 216, and tenth node 218 each are coupled. Based upon the voltage at twelfth node 220, e.g., $V_{DD}/2$, the components of master circuit 230 produce voltage $V_{BIAS}$ at fourth node 237. Note that twelfth node 220 need not necessarily be considered to be part of master circuit 230. For example, twelfth node 220 instead can be considered to be part of voltage shifting circuit 210, and master circuit 230 can be considered to be coupled to twelfth node 220.

In some embodiments, slave circuit 240 is in many respects is a replica of master circuit 230. The input node of master circuit 230 (third node 234) can be connected to $V_{DD}/2$, and the output node of master circuit 230 (fourth node 237) feeds back to the gates of tenth PMOS transistor 231 and tenth NMOS transistor 236, such that master circuit 230 can be a self-biased structure. Output $V_{BIAS}$ at fourth node 237 connects to, and biases, the gates of seventh PMOS transistor 241 and seventh NMOS transistor 246 of slave circuit 240. In some embodiments, $V_{BIAS}$ can be approximately $V_{DD}/2$, but can vary. Note that slave circuit 240 can function as an inverter that also includes a header (seventh PMOS transistor 241) and a footer (seventh NMOS transistor 246). The biasing of the gates of seventh PMOS transistor 241 and seventh NMOS transistor 246 by $V_{BIAS}$ can make the inverter trip point of slave circuit 240 similar to that of master circuit 230. As such, based upon $V_{IN}$ being smaller than $V_{DD}/2$, WD can go high. Based upon $V_{IN}$ being larger than $V_{DD}/2$, WD can go low.

Additionally, note that any suitable combination of other configurations of voltage shifting circuit 210, master circuit 230, and slave circuit 240 can be included in write detection circuit 140. For example, a write detection circuit can include slave circuit 240, and can include any suitable circuitry for generating $V_{IN}$ and $V_{BIAS}$, of which voltage shifting circuit 210 and master circuit 240 are only examples. Or, for example, a write detection circuit can include master circuit 230, and can include any suitable circuitry for producing the voltage at twelfth node 220 and for producing WD, of which voltage shifting circuit 210 and slave circuit 240 are only examples. Or, for example, a write detection circuit can include voltage shifting circuit 210, and can include any suitable circuitry for producing WD, of which master circuit 230 and slave circuit 240 are only examples. Additionally, note that write detection circuit 140 suitably can be implemented with any memory cell that includes an RRAM cell.

Moreover, note that each memory cell of a memory cell array need not necessarily include a voltage shifting circuit 210 and a master circuit 230 corresponding exclusively to that cell. Instead, memory cells of a memory cell array can share some or all components of voltage shifting circuit 210, or can share some or all components of master circuit 230, or can share some or all components of voltage shifting circuit 210 and some or all components of master circuit 230. For example, an exemplary memory cell array can include a first shared circuit that includes first PMOS transistor 211, eighth node 212, first node 215, second PMOS transistor 213, ninth node 214, operational amplifier 216, third PMOS transistor 217, tenth node 218, fourth PMOS transistor 219, and twelfth node 220; and a second shared circuit that includes third node 234 coupled to twelfth node 220, ninth PMOS transistor 232, tenth PMOS transistor 231, ninth NMOS transistor 233, tenth NMOS transistor 236, fourth node 237, and eleventh node 235. Each individual memory cell can include a corresponding third circuit that includes fifth PMOS transistor 221 coupled to the gate of shared third PMOS transistor 217, second node 223, and sixth PMOS transistor 222 including gate receiving DIO for that memory cell; as well as a corresponding fourth circuit that includes sixth node 247 which is coupled to shared fourth node 237, fifth node 244 which is coupled to the second node corresponding to that memory cell, seventh PMOS transistor 241, eight PMOS transistor 242, seventh NMOS transistor 246, eighth NMOS transistor 243, and seventh node providing WD for that memory cell. An exemplary cell array is described in greater detail below with reference to FIG. 11. It should be appreciated that by sharing certain components of write detection circuit 140 among a plurality of memory cells of an array, the footprint of each such memory cell can be reduced.

Figure 3:
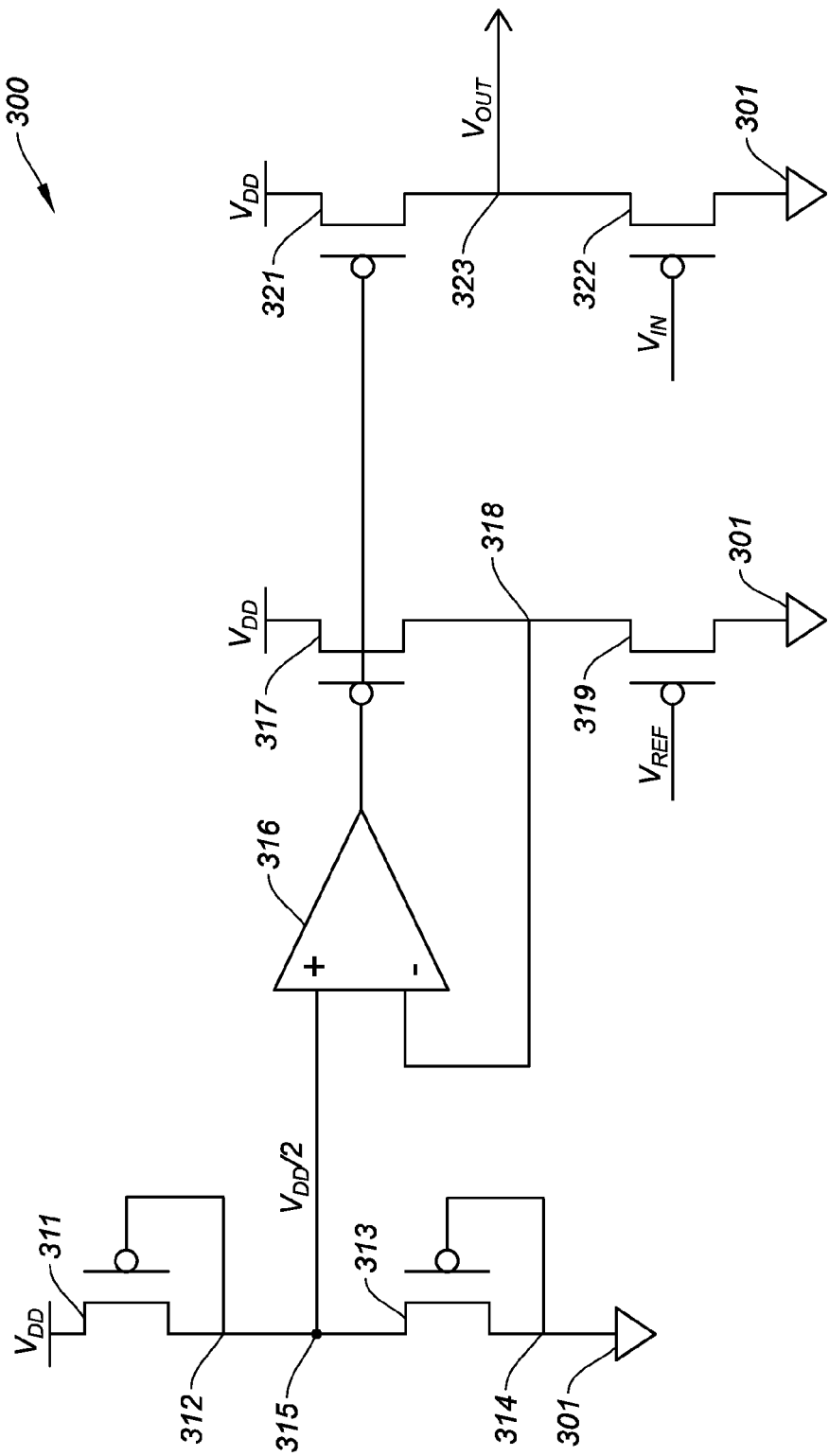
FIG. 3 illustrates an exemplary voltage shifting circuit, in accordance with some embodiments.

Additionally, note that voltage shifting circuit 210, master circuit 230, and slave circuit 240 each can be used independently from one another, and can be used independently of write detection circuit 140 or modification thereof. For example, FIG. 3 illustrates an exemplary voltage shifting circuit, in accordance with some embodiments. Voltage shifting circuit 300 illustrated in FIG. 3 includes first PMOS transistor 311 including a source coupled to a supply voltage $V_{DD}$, and a gate and a drain coupled to one another at first node 312. Voltage shifting circuit 300 also includes second PMOS transistor 313 including a gate and a drain coupled to one another at second node 314, and a source coupled to third node 315 which is coupled to first node 312. The drain of second PMOS transistor 313 also is coupled to a ground 301. Voltage shifting circuit 300 also includes operational amplifier 316 including a first input, a second input, and an output. The first input is coupled to third node 315 and receives from third node 315 a voltage approximately equal to $V_{DD}/2$. Voltage shifting circuit 300 also includes third PMOS transistor 317 including a source coupled to the supply voltage $V_{DD}$, a gate coupled to the output of operational amplifier 316, and a drain coupled to fourth node 318 which is coupled to the second input of operational amplifier 316. Voltage shifting circuit 300 also includes fourth PMOS transistor 319 including a source coupled to fourth node 318, a gate receiving a reference voltage $V_{REF}$, e.g., from I/O circuitry (not specifically illustrated), and a drain coupled to ground 301. Voltage shifting circuit 300 also includes fifth PMOS transistor 321 including a source coupled to the supply voltage $V_{DD}$, a gate coupled to the gate of third PMOS transistor 317, and a drain coupled to output node 323. Voltage shifting circuit 300 also includes sixth PMOS transistor 322 including a source coupled to output node 323, a gate receiving an input voltage $V_{IN}$, e.g., from I/O circuitry, from an RRAM cell or other memory cell, or from any other suitable circuit, and a drain coupled to ground 301. The output node has an output voltage $V_{OUT}$ based on $V_{DD}$, $V_{REF}$, and $V_{IN}$. For example, $V_{OUT}$ can be approximately equal to $V_{DD}/2-V_{IN}$. A value of $V_{IN}$ can vary between approximately 0 mV and approximately $V_{REF}$. In one non-limiting example, $V_{REF}$ is equal to 100 mV or less. In embodiments in which voltage shifting circuit 300 is coupled to an RRAM cell, $V_{IN}$ can be approximately equal to DIO, where DIO is a voltage based on a resistance of a programmable resistor in the RRAM cell. However, it should be appreciated that voltage shifting circuit 300 suitably can be used to shift any input voltage $V_{IN}$ to a higher level, e.g., to a level of approximately $V_{DD}/2-V_{IN}$ or, e.g., to shift any relatively small voltage signal level to a sufficiently higher voltage signal level for operation.

Figure 4:
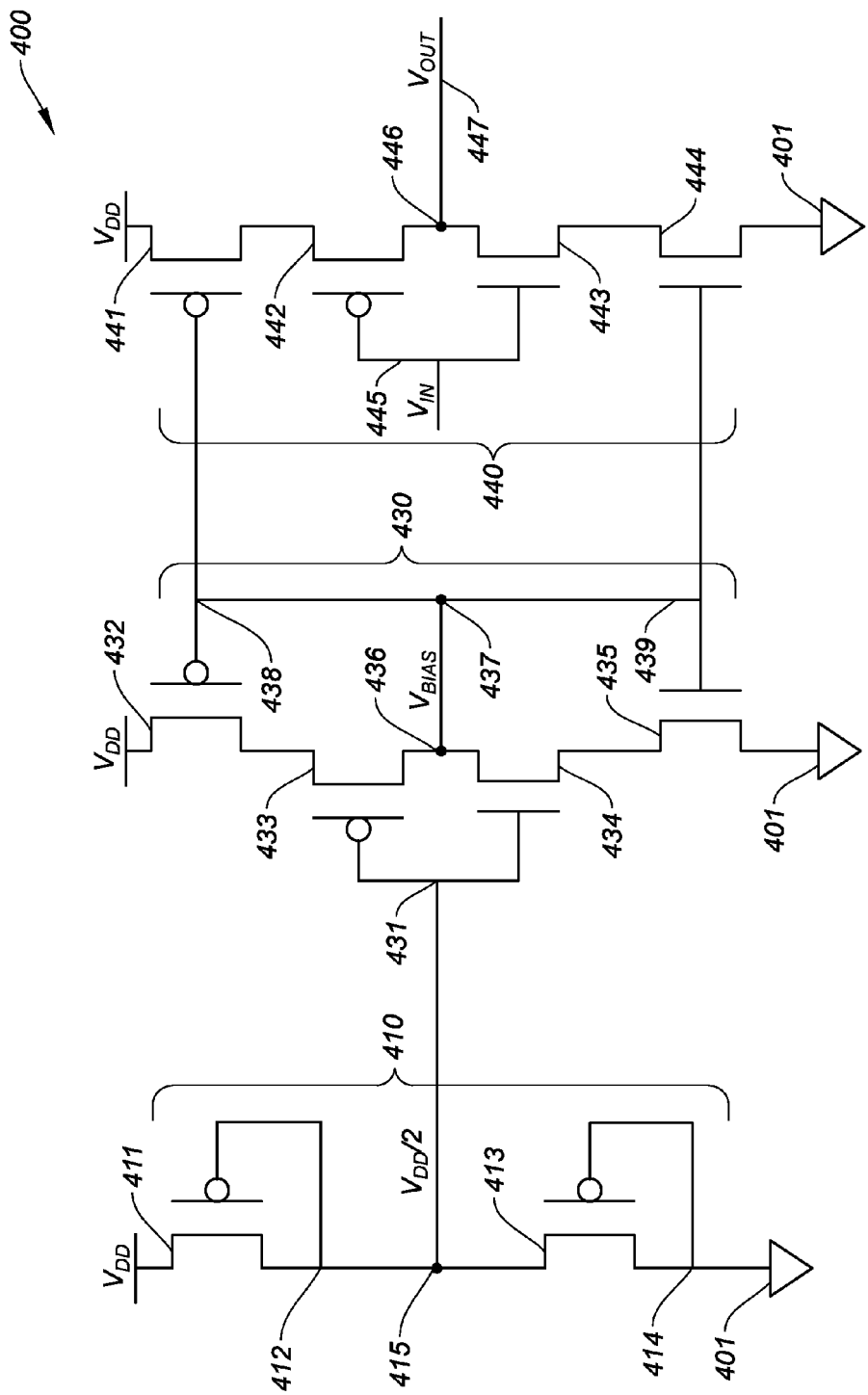
FIG. 4 illustrates an exemplary inverter comparator, in accordance with some embodiments.

As another example, FIG. 4 illustrates an exemplary inverter comparator, in accordance with some embodiments. Inverter comparator 400 illustrated in FIG. 4 includes a voltage divider 410 including first node 415 at a voltage of approximately $V_{DD}/2$, where $V_{DD}$ is a supply voltage. Inverter comparator 400 illustrated in FIG. 4 also includes master circuit 430 including second node 431 and third node 437. In the illustrated embodiment, second node 431 is coupled to first node 415 of voltage divider 410, and third node 437 is at a bias voltage $V_{BIAS}$. Inverter comparator 400 illustrated in FIG. 4 also includes slave circuit 440. Slave circuit 440 includes first PMOS transistor 441 including a source coupled to the supply voltage $V_{DD}$, and a gate coupled to third node 437 via fourth node 438. Slave circuit 440 also includes second PMOS transistor 442 including a source coupled to the drain of first PMOS transistor 441. Slave circuit 440 also includes first NMOS transistor 444 including a gate coupled to third node 439 via fifth node, and a drain coupled to a ground 401. Slave circuit 440 also includes second NMOS transistor 443 including a drain coupled to the source of first NMOS transistor 444. Slave circuit 440 also includes a sixth node to which the gate of second PMOS transistor 442 and the gate of second NMOS transistor 443 are coupled. The sixth node receives an input voltage $V_{IN}$, e.g., from I/O circuitry, from an RRAM cell or other memory cell, or from any other suitable circuit. Slave circuit 440 also includes seventh node 446 to which the drain of second PMOS transistor 442 and the source of second NMOS transistor 443 are coupled. The seventh node has an output voltage $V_{OUT}$ based on the input voltage $V_{IN}$, the supply voltage $V_{DD}$, and the bias voltage $V_{BIAS}$. In one nonlimiting example, $V_{OUT}$ is high based on the input voltage $V_{IN}$ being equal to or exceeding the bias voltage $V_{BIAS}$. In another nonlimiting example, $V_{OUT}$ is low based on the input voltage $V_{IN}$ being less than the bias voltage $V_{BIAS}$. Accordingly, based on certain changes in the value of $V_{IN}$ relative to $V_{BIAS}$, the value of $V_{OUT}$ can transition between high and low. For example, in embodiments where inverter comparator 400 is adapted for use in a write detection circuit 140 of a memory cell 100, such as described above with reference to FIGS. 1 and 2, $V_{IN}$ can be approximately equal to $V_{DD}/2$–DIO, where DIO is based on a resistance of a programmable resistor in a resistive random access memory (RRAM) cell to which inverter comparator 400 is coupled via sixth node 445. In one nonlimiting example, the value of $V_{IN}$ varies between approximately 0 mV and approximately 100 mV.

In the embodiment illustrated in FIG. 4, master circuit 430 includes third PMOS transistor 433 including a gate coupled to second node 431. Master circuit 430 also includes fourth PMOS transistor 432 including a source coupled to the supply voltage $V_{DD}$, a drain coupled to the source of third PMOS transistor 433, and a gate coupled to fourth node 438. Master circuit 430 also includes third NMOS transistor 434 including a gate coupled to second node 431. Master circuit 430 also includes fourth NMOS transistor 435 including a source coupled to the drain of third NMOS transistor 434, a drain coupled to ground 401, and a gate coupled to fifth node 439. Master circuit 430 also includes eighth node 436 to which third node 437, the drain of third PMOS transistor 433, and the source of third NMOS transistor 434 are coupled. Additionally, in the embodiment illustrated in FIG. 4, voltage divider 410 includes fifth PMOS transistor 411 including a source coupled to the supply voltage $V_{DD}$, and a gate and a drain coupled to one another at ninth node 412, ninth node 412 being coupled to first node 415. Voltage divider 410 also includes sixth PMOS transistor 413 including a source coupled to first node 415, and a gate and a drain coupled to one another at tenth node 414, the drain of sixth PMOS transistor 413 also being coupled to ground 401. However, it should be appreciated that other circuits that are suitably configured to provide functions analogous to those of master circuit 430 and voltage divider 410 suitably can be used.

So as to facilitate understanding of exemplary functionalities of memory cell 100 illustrated in FIG. 1 and write detection circuit 140 illustrated in FIG. 2, a comparative operational amplifier that could substituted for write detection circuit 140 will be described with reference to FIG. 5. Subsequently, simulated performances of memory cell 100 including either the comparative operational amplifier or the present write detection circuit 140 will be described with reference to FIGS. 6-9.

FIG. 5 illustrates a comparative operational amplifier 500. Comparative operational amplifier 500 includes first PMOS transistor 510 including a source coupled to supply voltage $V_{DD}$, a gate coupled to a bias voltage $V_{BIAS}$ (first input to comparative operational amplifier 500), e.g., supplied by I/O circuitry (not illustrated), and a drain coupled to first node 511. Comparative operational amplifier 500 further includes second PMOS transistor 520 including a source coupled to first node 511, a gate coupled to DIO (second input to comparative operational amplifier 500), e.g., a voltage based on the resistance of programmable resistor 121 of memory cell 100 illustrated in FIG. 1, and a drain coupled to second node 522. Comparative operational amplifier 500 illustrated in FIG. 5 also includes first NMOS transistor 521 including a source coupled to second node 522, a gate coupled to third node 523, wherein third node 523 is coupled to second node 522, and a drain coupled to ground 501. Comparative operational amplifier 500 also includes third PMOS transistor 530 including a source coupled to first node 511, a gate coupled to a reference voltage $V_{REF}$ (third input to comparative operational amplifier 500), e.g., supplied by I/O circuitry (not illustrated), and a drain coupled to fourth node 532. Comparative operational amplifier 500 also includes second NMOS transistor 531 including a source coupled to fourth node 532, a gate coupled to third node 523, and a drain coupled to ground 501. Fourth node 532 is at an output voltage $V_{OUT}$ representative of the value of DIO relative to $V_{REF}$. Because DIO can be relatively low, e.g., can vary between approximately 0 mV and approximately 100 mV in one nonlimiting example, and $V_{BIAS}$ and $V_{REF}$ also can be relatively low, e.g., can be approximately equal to the maximum value of DIO under normal operating conditions, it can be difficult to sustain saturation of first PMOS transistor 510, second PMOS transistor 520, and third PMOS transistor 530, thus reducing accuracy of the value of $V_{OUT}$, e.g., reducing the accuracy of write detection.

Figure 6:
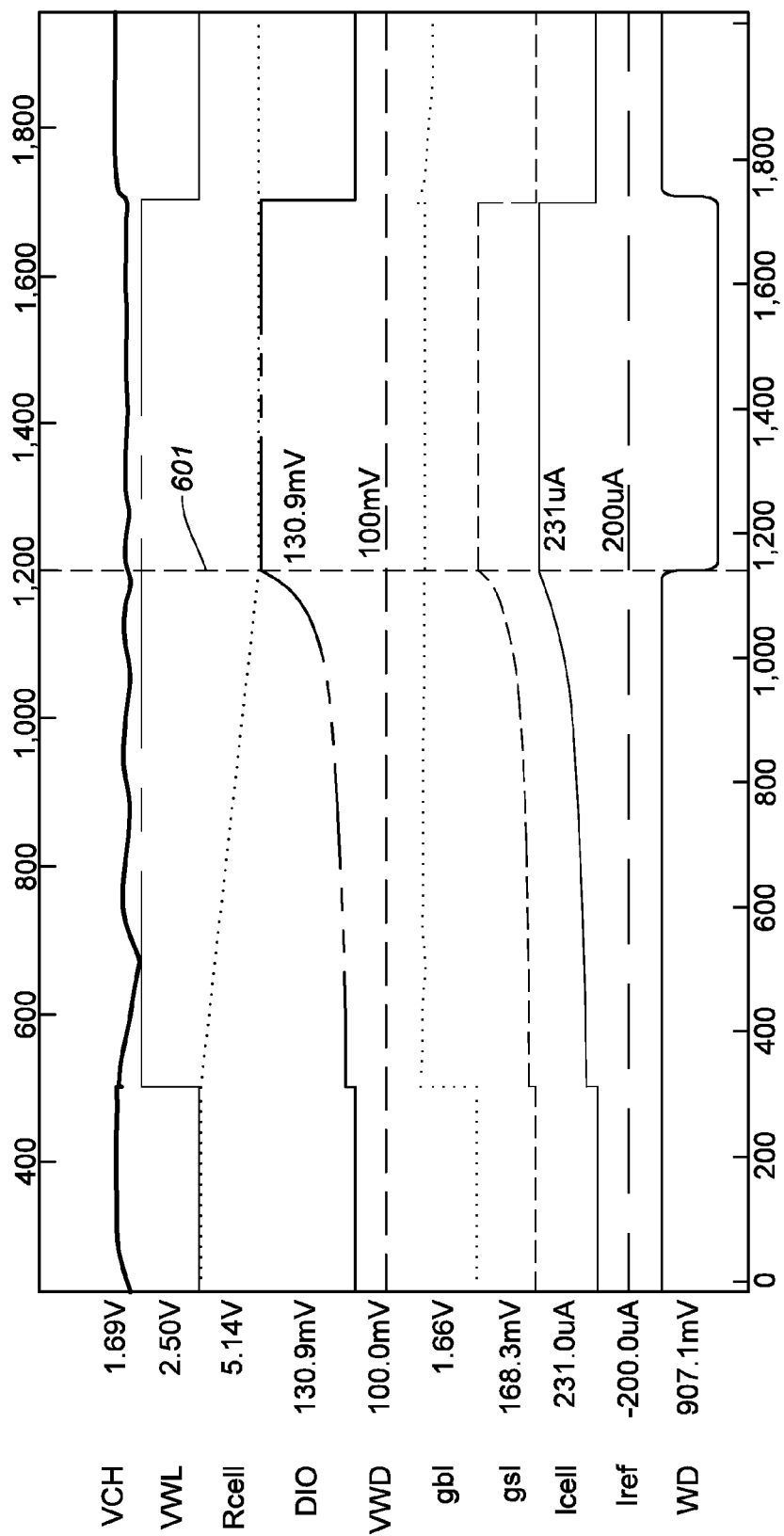
FIG. 6 illustrates exemplary signals in the memory cell of FIG. 1 including the comparative operational amplifier of FIG. 5 as a function of time during a SET operation.

FIG. 6 illustrates exemplary simulated signals in a memory cell, e.g., memory cell 100 illustrated in FIG. 1, including the comparative operational amplifier of FIG. 5 as a function of time during a SET operation. The signals were simulated using the FINESIM™ circuit simulator that is commercially available from Synopsys, Inc. (Mountain View, Calif.). In FIG. 6, $V_{CH}$ corresponds to the voltage applied to the source of bit line transistor 111 illustrated in FIG. 1; $V_{WL}$ corresponds to the voltage applied to the gate of select transistor 122 illustrated in FIG. 1; $R_{CELL}$ corresponds to the resistance of RRAM cell 120 illustrated in FIG. 1; DIO corresponds to the voltage at node 123 illustrated in FIG. 1 and applied as the second input to comparative operational amplifier 500 illustrated in FIG. 5; $V_{WD}$ is constant; gbl corresponds to global bit-line; gsl corresponds to global source-line; $I_{CELL}$ corresponds to the current through RRAM cell 120 illustrated in FIG. 1; $I_{REF}$ corresponds to the reference current generated by current source 131 illustrated in FIG. 1; and WD corresponds to the output ($V_{OUT}$) of comparative operational amplifier 500.

The plots illustrated in FIG. 6 were prepared by initially simulating the respective voltages, resistances, or currents at the beginning of a SET operation, and then simulating changes in those values as a function of time. The time of transition of programmable resistor 121 from the relatively high resistance to the relatively low resistance is represented in FIG. 6 by dotted line 601. In FIG. 6, it can be seen that $I_{CELL}$ obtains a maximum value of approximately 231 μA following transition of programmable resistor 121 from the relatively high resistance to the relatively low resistance. Additionally, it can be seen that $I_{REF}$ is approximately 200 μA (noting that this is a pre-set value in the simulation). Accordingly, in this simulation, $I_{CELL}$ exceeds $I_{REF}$ by approximately 31 μA, corresponding to an over-SET condition that potentially may decrease reliability of memory cell 100. Accordingly, second NMOS transistor 135 illustrated in FIG. 1 may not necessarily be able to fully limit cell current $I_{CELL}$ to a value approximately equal to $I_{REF}$, for example, if comparative operational amplifier 500 illustrated in FIG. 5 is coupled to node 123 instead of the present write detection circuit 140 illustrated in FIG. 2 or the alternative write detection circuit 140' illustrated in FIG. 10. Additionally, in FIG. 6, it can be seen that WD transitions from logical 1 to logical 0, representing the detection of the SET operation by comparative operational amplifier 500. Note that a relatively large gap between $I_{REF}$ and $I_{CELL}$, such as in the simulation results illustrated in FIG. 6, can cause over write and stress, and can detrimentally impact the endurance of an RRAM cell.

Figure 7:
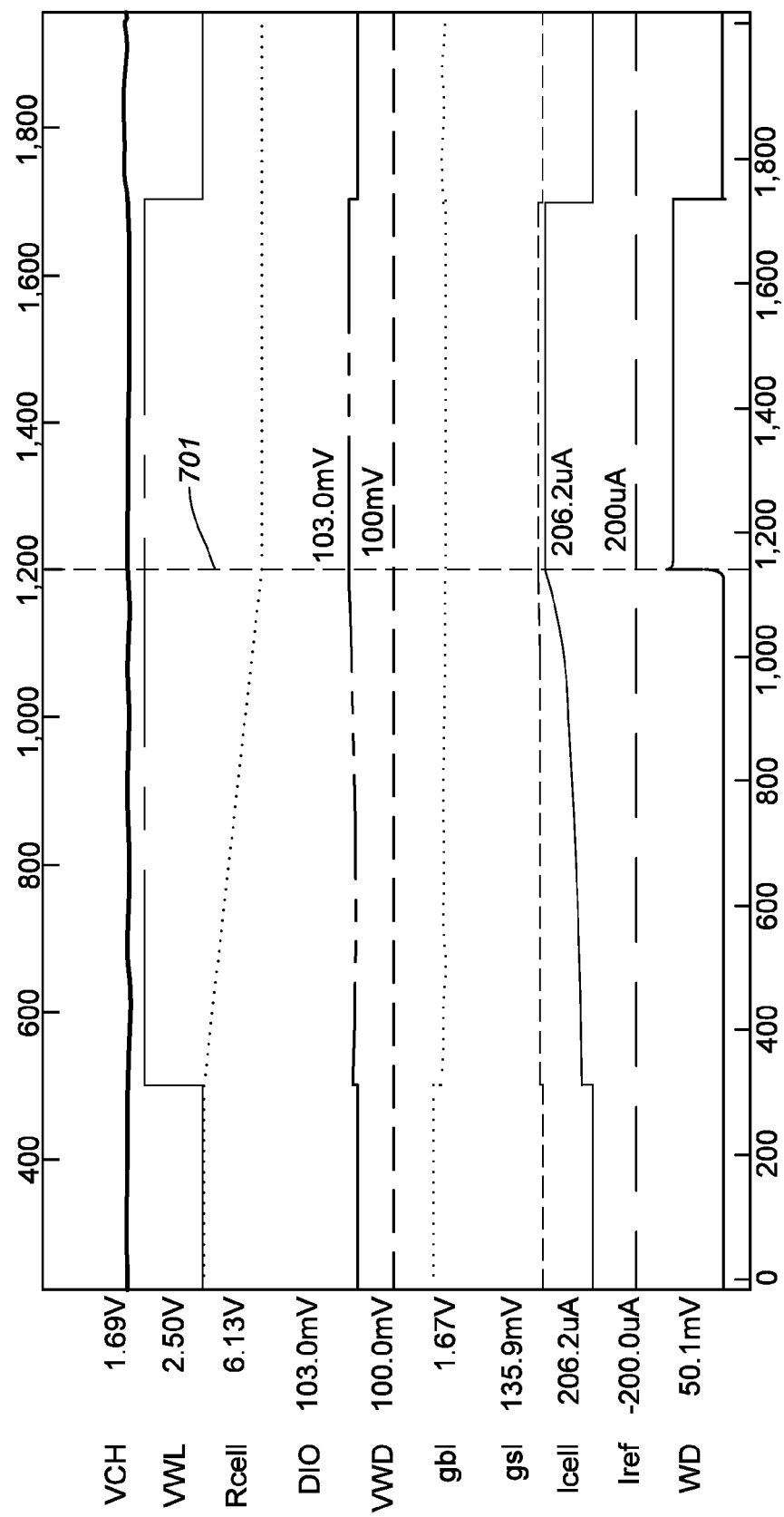
FIG. 7 illustrates exemplary signals in the memory cell of FIG. 1 including the write detection circuit of FIG. 2 as a function of time during a SET operation, in accordance with some embodiments.

FIG. 7 illustrates exemplary signals in the memory cell of FIG. 1 including write detection circuit 140 of FIG. 2 as a function of time during a SET operation, in accordance with some embodiments. In FIG. 7, $V_{CH}$ corresponds to the voltage applied to the source of bit line transistor 111 illustrated in FIG. 1; $V_{WL}$ corresponds to the voltage applied to the gate of select transistor 122 illustrated in FIG. 1; $R_{CELL}$ corresponds to the resistance of RRAM cell 120 illustrated in FIG. 1; DIO corresponds to the voltage at node 123 illustrated in FIG. 1 and applied to the gate of sixth PMOS transistor 222 of voltage shifting circuit 210 illustrated in FIG. 2; $V_{WD}$ again is constant; gbl corresponds to global bit-line; gsl corresponds to global source-line; $I_{CELL}$ corresponds to the current through RRAM cell 120 illustrated in FIG. 1; $I_{REF}$ corresponds to the reference current generated by current source 131 illustrated in FIG. 1; and WD corresponds to the output at seventh node 245 of slave circuit 240 of write detection circuit 140 illustrated in FIG. 2.

Analogously as for FIG. 6, the plots illustrated in FIG. 7 were prepared by initially simulating the respective voltages, resistances, or currents at the beginning of a SET operation, and then simulating changes in those values as a function of time. The time of transition of programmable resistor 121 from the relatively high resistance to the relatively low resistance is represented in FIG. 7 by dotted line 701. In FIG. 7, it can be seen that at $I_{CELL}$ obtains a maximum value of approximately 206.2 µA following transition of programmable resistor 121 from the relatively high resistance to the relatively low resistance. Additionally, it can be seen that $I_{REF}$ is approximately 200 µA. Accordingly, $I_{CELL}$ exceeds $I_{REF}$ by approximately 6.2 µA, corresponding to a significant limiting of cell current relative to that achieved using comparative operational amplifier 500 illustrated in FIG. 5. Additionally, in FIG. 7, it can be seen that WD transitions from logical 0 to logical 1, representing the detection of the SET operation by write detection circuit 140.

Figure 8:
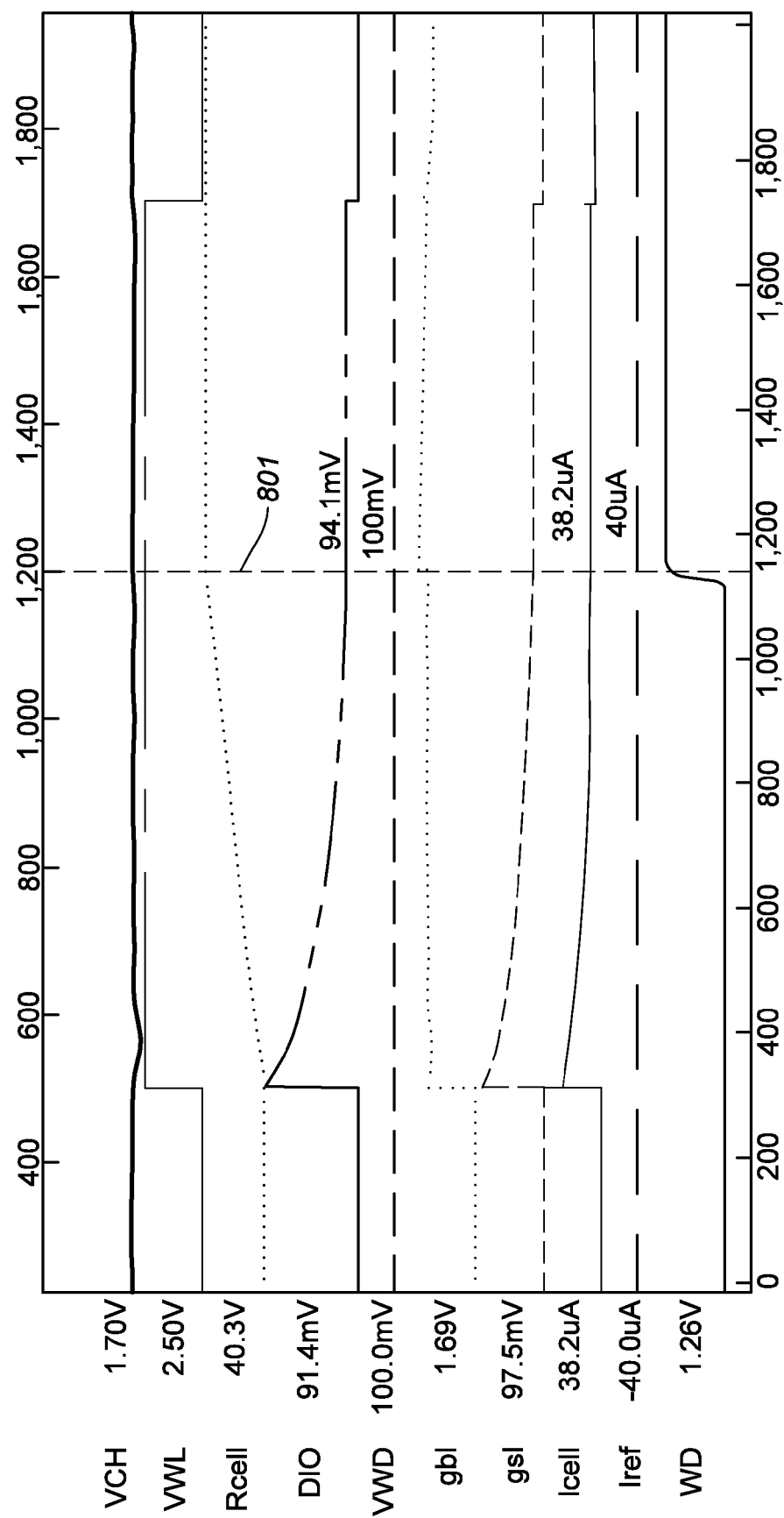
FIG. 8 illustrates exemplary signals in the memory cell of FIG. 1 including the comparative operational amplifier of FIG. 5 as a function of time during a RESET operation.

FIG. 8 illustrates exemplary signals in a memory cell including the comparative operational amplifier of FIG. 5 as a function of time during a RESET operation. The signals illustrated in FIG. 8 are analogous to those described above with reference to FIG. 6, except that the plots illustrated in FIG. 8 were prepared by initially simulating the respective voltages, resistances, or currents at the beginning of a RESET operation, and then simulating changes in those values as a function of time. The time of transition of programmable resistor 121 from the relatively low resistance to the relatively high resistance is represented in FIG. 8 by dotted line 801. In FIG. 8, it can be seen that at $I_{CELL}$ obtains a minimum value of approximately 38.2 µA following transition of programmable resistor 121 from the relatively high resistance to the relatively low resistance. Additionally, it can be seen that $I_{REF}$ is approximately 40 µA. Accordingly, $I_{CELL}$ undershoots $I_{REF}$ by approximately 1.8 µA, corresponding to an under-RESET condition that potentially may decrease reliability of memory cell 100. Additionally, in FIG. 6, it can be seen that WD transitions from logical 1 to logical 0, representing the detection of the RESET operation by comparative operational amplifier 500.

Figure 9:
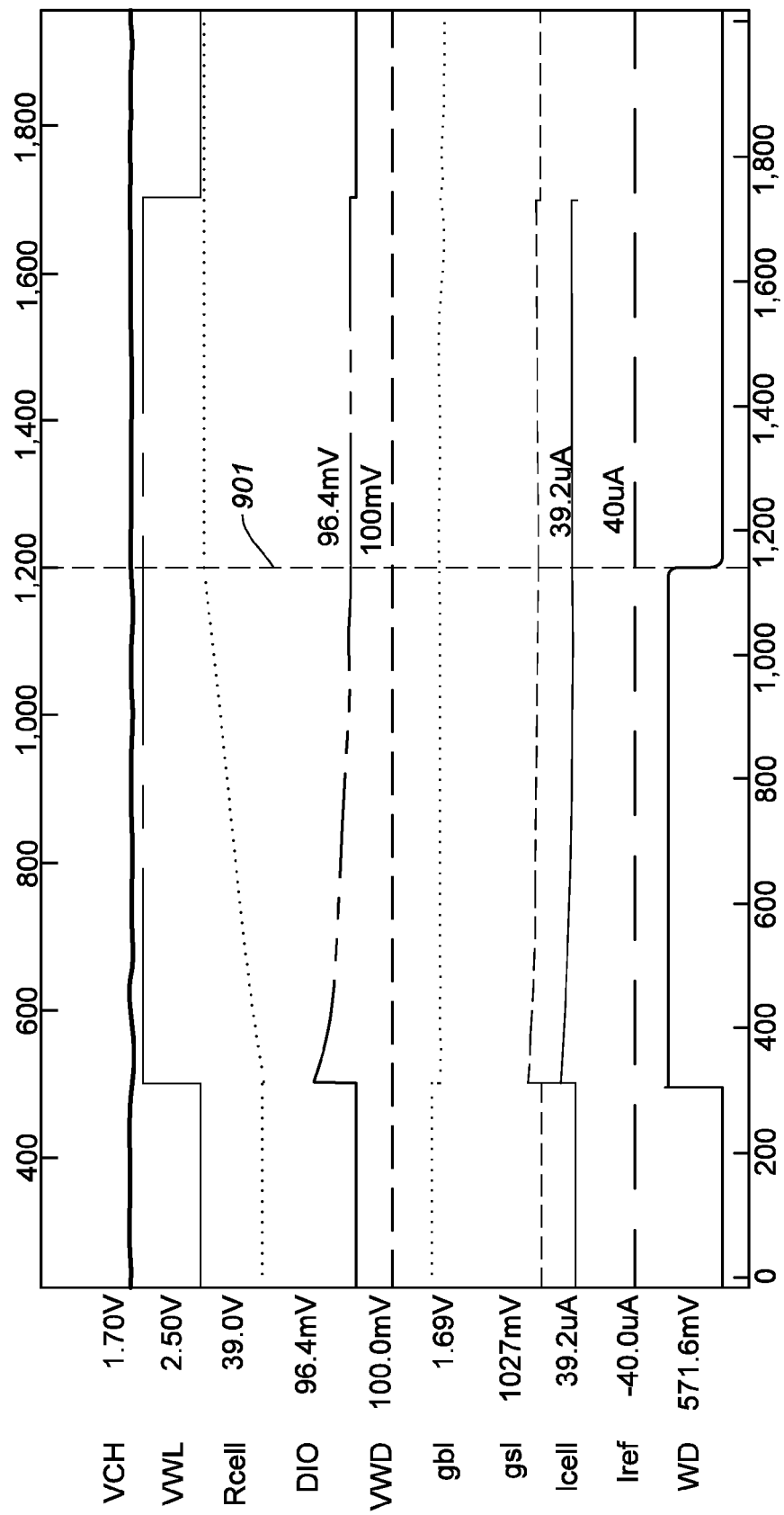
FIG. 9 illustrates exemplary signals in the memory cell of FIG. 1 including the write detection circuit of FIG. 2 as a function of time during a RESET operation, in accordance with some embodiments.

FIG. 9 illustrates exemplary signals in the memory cell of FIG. 1 including the write detection circuit of FIG. 2 as a function of time during a RESET operation, in accordance with some embodiments. The signals illustrated in FIG. 9 are analogous to those described above with reference to FIG. 7, except that the plots illustrated in FIG. 9 were prepared by initially simulating the respective voltages, resistances, or currents at the beginning of a RESET operation, and then simulating changes in those values as a function of time. The time of transition of programmable resistor 121 from the relatively low resistance to the relatively high resistance is represented in FIG. 9 by dotted line 901. In FIG. 9, it can be seen that at $I_{CELL}$ obtains a minimum value of approximately 57.5 µA following transition of programmable resistor 121 from the relatively high resistance to the relatively low resistance. Additionally, it can be seen that $I_{REF}$ is approximately 60 µA. Accordingly, $I_{CELL}$ undershoots $I_{REF}$ by approximately 2.5 µA, corresponding to a significant limiting of cell current relative to that achieved using comparative operational amplifier 500 illustrated in FIG. 5. Additionally, in FIG. 9, it can be seen that WD transitions from logical 1 to logical 0 when programmable resistor 121 switches to the relatively high resistance, representing the detection of the RESET operation by write detection circuit 140.

Accordingly, it should be appreciated that the present write detection circuits and components thereof can provide significantly improved write detection or current limiting, or both, and accordingly can enhance the reliability of RRAM cells that are coupled to such a write detection circuit.

Figure 10:
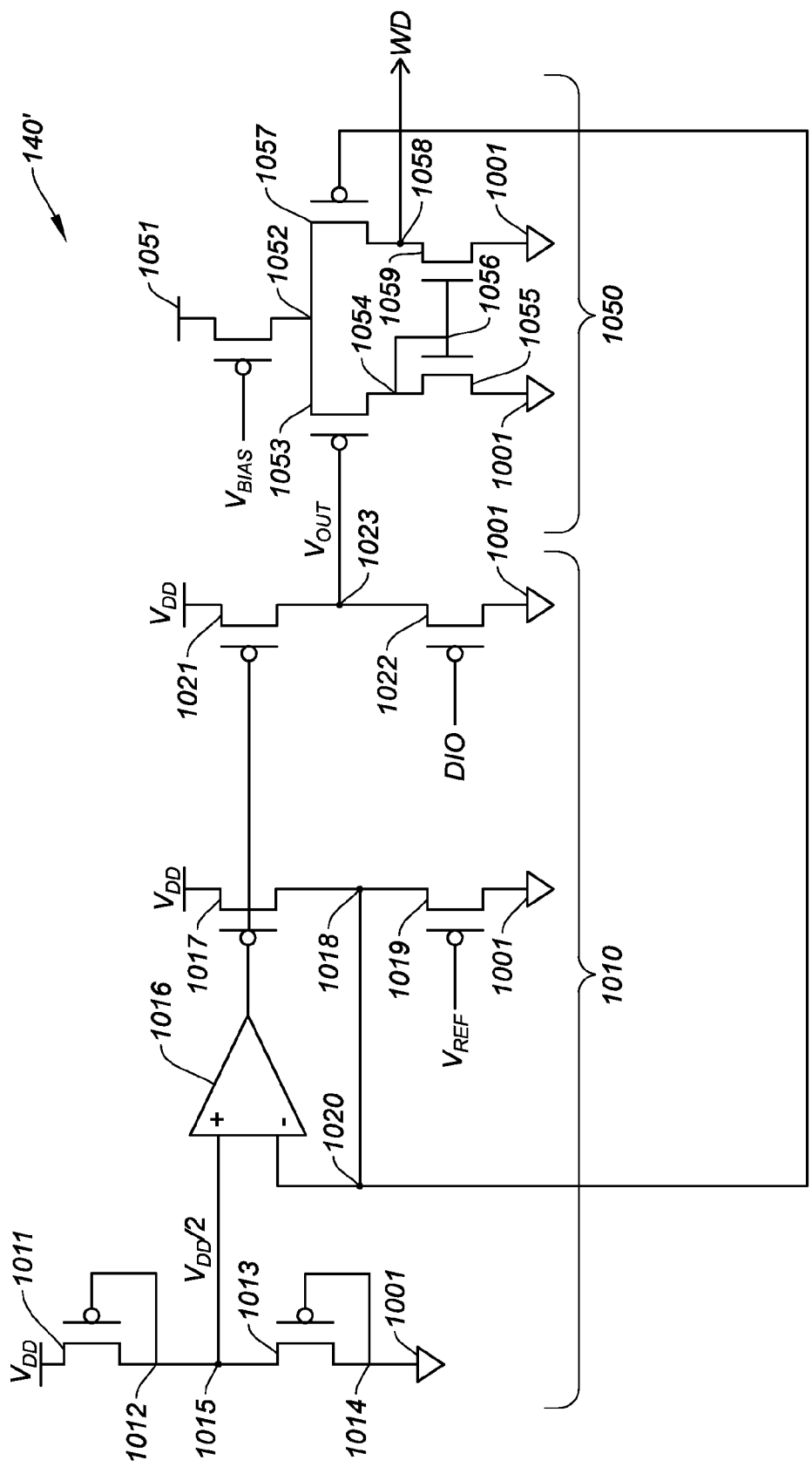
FIG. 10 illustrates an alternative write detection circuit, in accordance with some embodiments.

As noted further above, a write detection circuit need not necessarily include all components illustrated in the embodiment of FIG. 2 in order to enhance write detection or current limiting, or both, of an RRAM cell. For example, FIG. 10 illustrates an alternative write detection circuit 140', in accordance with some embodiments. Alternative write detection circuit 104' includes voltage shifting circuit 1010 and operational amplifier 1050. Voltage shifting circuit 1010 illustrated in FIG. 10 includes first PMOS transistor 1011 including a source coupled to a supply voltage $V_{DD}$, and a gate and a drain coupled to one another at first node 1012. Voltage shifting circuit 1010 also includes second PMOS transistor 1013 including a gate and a drain coupled to one another at second node 1014, and a source coupled to third node 1015 which is coupled to first node 1012. The drain of second PMOS transistor 1013 also is coupled to a ground 1001. Voltage shifting circuit 1010 also includes operational amplifier 1016 including a first input, a second input, and an output. The first input is coupled to third node 1015 and receives from third node 1015 a voltage approximately equal to $V_{DD}/2$. Voltage shifting circuit 1010 also includes third PMOS transistor 1017 including a source coupled to the supply voltage $V_{DD}$, a gate coupled to the output of operational amplifier 1016, and a drain coupled to fourth node 1018 which is coupled to the second input of operational amplifier 1016 via fifth node 1020. Voltage shifting circuit 1010 also includes fourth PMOS transistor 1019 including a source coupled to fourth node 1018, a gate receiving a reference voltage $V_{REF}$, e.g., from I/O circuitry (not specifically illustrated), and a drain coupled to ground 1001.

Voltage shifting circuit 1010 also includes fifth PMOS transistor 1021 including a source coupled to the supply voltage $V_{DD}$, a gate coupled to the gate of third PMOS transistor 1017, and a drain coupled to sixth node 1023. Voltage shifting circuit 1010 also includes sixth PMOS transistor 1022 including a source coupled to sixth node 1023, a gate receiving DIO from an RRAM cell or other memory cell, or any other suitable input voltage, e.g., from I/O circuitry, or from any other suitable circuit, and a drain coupled to ground 1001. The sixth node has a voltage $V_{OUT}$ based on $V_{DD}$, $V_{REF}$, and $V_{IN}$. For example, $V_{OUT}$ can be approximately equal to $V_{DD}/2-V_{IN}$. A value of $V_{IN}$ can vary between approximately 0 mV and approximately $V_{REF}$. In one nonlimiting example, $V_{REF}$ is equal to 100 mV or less. In embodiments in which voltage shifting circuit 1010 is coupled to an RRAM cell, DIO is a voltage based on a resistance of a programmable resistor in the RRAM cell. However, it should be appreciated that voltage shifting circuit 1010 suitably can be used to shift any input voltage $V_{IN}$ to a higher level, e.g., to a level of approximately $V_{DD}/2-V_{IN}$.

Operational amplifier 1050 of alternative write detection circuit 140' includes seventh PMOS transistor 1051 including a source coupled to supply voltage $V_{DD}$, a gate coupled to a bias voltage $V_{BIAS}$ (first input to operational amplifier 1050), e.g., supplied by I/O circuitry (not illustrated), and a drain coupled to seventh node 1052. Operational amplifier 1050 further includes eighth PMOS transistor 1053 including a source coupled to seventh node 1052, a gate coupled to $V_{OUT}$ (second input to operational amplifier 1050), and a drain coupled to eighth node 1054. Operational amplifier 1050 illustrated in FIG. 10 also includes first NMOS transistor 1055 including a source coupled to eighth node 1054, a gate coupled to ninth node 1056, wherein ninth node 1056 is coupled to eighth node 1054, and a drain coupled to ground 1001. Operational amplifier 1050 also includes ninth PMOS transistor 1057 including a source coupled to seventh node 1052, a gate coupled to fifth node 1020 (third input to operational amplifier 1050), and a drain coupled to tenth node 1058. Operational amplifier 1050 also includes second NMOS transistor 1059 including a source coupled to tenth node 1058, a gate coupled to ninth node 1056, and a drain coupled to ground 1001. Tenth node 1058 is at an output voltage WD representative of the value of DIO relative to $V_{REF}$. Certain components of alternative write detection circuit 140' can be shared by memory cells of a memory cell array 1100 in a manner analogous to that described above with reference to FIG. 2.

Figure 11:
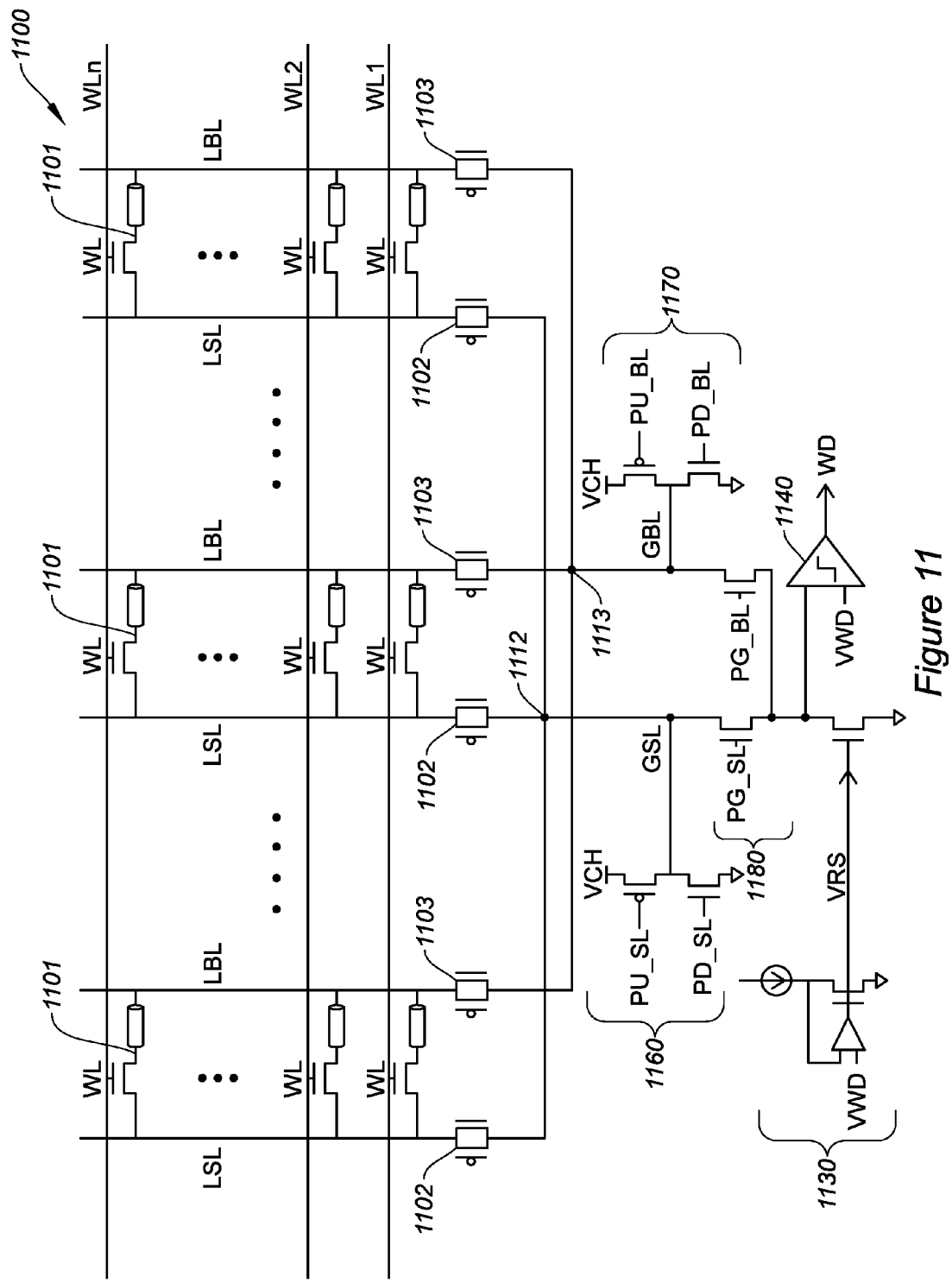
FIG. 11 illustrates an exemplary cell array structure, in accordance with some embodiments.

Additionally, as noted further above, memory cell arrays can share certain components so as to reduce the footprint of each cell in the array. For example, FIG. 11 illustrates an exemplary memory cell array 1100 that includes a plurality of RRAM cells 1101, each of which includes a select transistor and a programmable resistor (components not individually labeled in FIG. 11). The source of the select transistor of each RRAM cell 1101 can be coupled to the programmable resistor of that RRAM cell; the gate of that select transistor can be coupled to a shared word line WL1, WL2, . . . WLn; and the drain of that select transistor can be coupled to a shared local source line LSL. The programmable resistor of that RRAM cell also can be coupled to a shared local bit line LBL. However, it should be appreciated that a reverse RRAM cell configuration suitably can be used.

The memory cell array 1100 illustrated in FIG. 11 further includes a plurality of column multiplexers 1102, e.g., a plurality of PMOS and NMOS column MUX, that respectively are coupled to one of the local source lines (LSL), and a plurality of column multiplexers 1103, e.g., a plurality of PMOS and NMOS column MUX, that respectively are coupled to one of the local bit lines (LBL). The local source lines (LSL) respectively are coupled to a common source line node 1112 via column multiplexers 1102; and the local bit lines (LBL) respectively are coupled to a common bit line node 1113 via column multiplexers 1103.

The memory cell array 1100 illustrated in FIG. 11 further includes current limiter 1130 that can be configured analogously to current limiter 130 described above with reference to FIG. 1; write detection circuit 1140 that can be configured analogously to write detection circuit 140 described above with reference to FIG. 1; first circuit 1160, second circuit 1170, and third circuit. First circuit 1160 includes a PMOS transistor, the source of which receives $V_{CH}$, the gate of which receives PU_SL (signal to pull up SL to $V_{CH}$); and an NMOS transistor, the source of which is coupled to the drain of that PMOS transistor, the gate of which receives PD_SL (signal to pull down SL to GND), and the drain of which is coupled to ground (GND). The drain of the PMOS transistor and the source of the NMOS transistor are coupled to a common node at GSL. Second circuit 1170 includes a PMOS transistor, the source of which receives $V_{CH}$, the gate of which receives PU_BL (signal to pull up BL to $V_{CH}$); and an NMOS transistor, the source of which is coupled to the drain of that PMOS transistor, the gate of which receives PD_BL (signal to pull down BL to GND), and the drain of which is coupled to ground (GND). The drain of the PMOS transistor and the source of the NMOS transistor are coupled to a common node at GBL. Third circuit 1180 includes a first NMOS transistor, the source of is coupled to the common node at GSL, the gate of which receives PG_SL (signal to connect GSL to write-detection circuit 140); and a second NMOS transistor, the source of which is coupled to the common node at GBL, the gate of which receives PG_BL (signal to connect GBL to write-detection circuit), and the drain of which is coupled to a node between current limiter 1130 and write detection circuit 1140 (corresponding to node 123 illustrated in FIG. 1). The drains of the first and second NMOS transistors are coupled to the node between current limiter 1130 and write detection circuit 1140.

Figure 12:
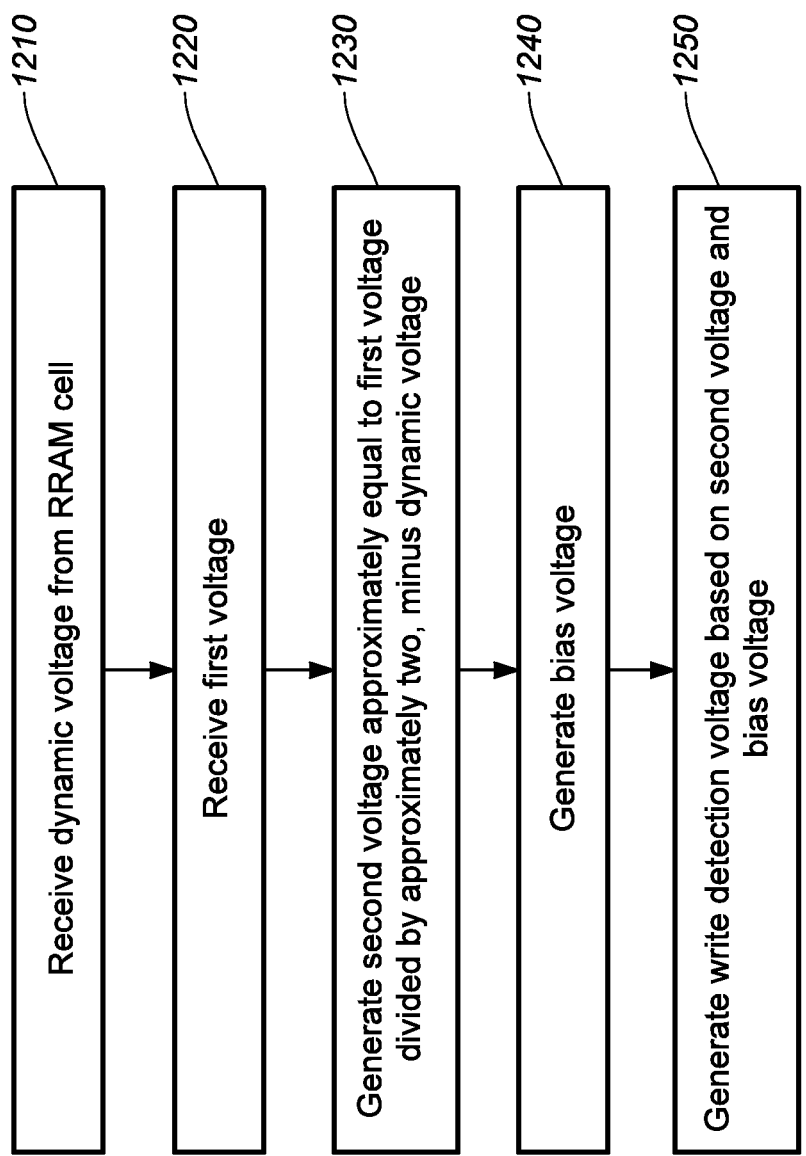
FIG. 12 illustrates steps in an exemplary method for write detection, in accordance with some embodiments.

Methods for write detection also are provided herein, such as described above with reference to the circuits illustrated in FIGS. 1-4, 10, and 11. Additionally, FIG. 12 illustrates steps in an exemplary method 1200 for write detection, in accordance with some embodiments. Method 1200 includes receiving a dynamic voltage from a resistive random access memory (RRAM) cell (1210). In some embodiments, the RRAM cell is configured in a manner analogous to that described above with reference to FIG. 1 or FIG. 11. In one nonlimiting example, the RRAM cell includes a select transistor and a programmable resistor, coupled to a source or a drain of the select transistor. The programmable resistor can be configured to change between a relatively high resistance and a relatively low resistance responsive to changes in a cell current through the RRAM cell, the dynamic voltage being based on the resistance of the programmable resistor of the RRAM cell. Method 1200 also includes receiving a first voltage (1220). For example, the first voltage can be received by a voltage shifting circuit such as described in greater detail above with reference to FIG. 2. Method 1200 also includes generating a second voltage approximately equal to the first voltage divided by approximately two, minus the dynamic voltage (1230). For example, the second voltage can be generated by a voltage shifting circuit such as described in greater detail above with reference to FIG. 2. Method 1200 also includes generating a bias voltage (1240). For example, the bias voltage can be generated by an inverter comparator circuit such as described in greater detail above with reference to FIG. 2. Method 1200 also includes generating a write detection voltage based on the second voltage and the first bias voltage (1250). For example, the write detection voltage can be generated by an inverter comparator circuit such as described in greater detail above with reference to FIG. 2.

Based on the foregoing, it should be appreciated that the present write detection circuits and methods can provide relatively reliable write detection, e.g., for SET and RESET operations of an RRAM cell; can reduce the footprint of each memory cell of an array by sharing certain components of the write detection circuit between memory cells; can improve control of current limiting through the RRAM cell so as to reduce or inhibit over-SET operation; and can improve reliability of the RRAM cell.

In one illustrative embodiment, a memory cell includes a resistive random access memory (RRAM) cell. The RRAM cell includes a select transistor; and a programmable resistor, coupled to a source or a drain of the select transistor. The programmable resistor is configured to change between a relatively high resistance and a relatively low resistance responsive to changes in a cell current through the RRAM cell. A dynamic voltage is based on the resistance of the programmable resistor of the RRAM cell. The memory cell also includes a write detection circuit coupled to the RRAM cell and configured to receive the dynamic voltage therefrom. The write detection circuit includes a voltage shifting circuit configured to receive the dynamic voltage and a first voltage and to provide as output a second voltage approximately equal to the first voltage divided by approximately two, minus the dynamic voltage. The write detection circuit also includes an inverter comparator circuit including a master circuit and a slave circuit. The master circuit is coupled to the voltage shifting circuit and is configured to provide as output a first bias voltage. The slave circuit is coupled to the voltage shifting circuit and to the master circuit and is configured to provide as output a write detection voltage based on the second voltage and the first bias voltage.

In another illustrative embodiment, a voltage shifting circuit includes a first circuit configured to receive a first voltage and that is coupled to a ground and being configured to output a second voltage. The voltage shifting circuit also includes an operational amplifier including a first input, a second input, and an output. The first input is coupled to the first circuit and configured to receive the second voltage therefrom. The operational amplifier outputs at the output a bias voltage. The voltage shifting circuit also includes a second circuit that is coupled to the second input and the output of the operational amplifier and configured to receive the bias voltage and a reference voltage. The voltage shifting circuit also includes a third circuit that is coupled to the second circuit and to the output of the operational amplifier. The third circuit includes an output node, and is configured to receive the bias voltage and a dynamic voltage and to output at the output node an output voltage based on the first voltage and the dynamic voltage.

In still another illustrative embodiment, a method includes receiving a dynamic voltage from a resistive random access memory (RRAM) cell. In some embodiments, the RRAM cell includes a select transistor and a programmable resistor, coupled to a source or a drain of the select transistor. The programmable resistor can be configured to change between a relatively high resistance and a relatively low resistance responsive to changes in a cell current through the RRAM cell, the dynamic voltage being based on the resistance of the programmable resistor of the RRAM cell. The method also includes receiving a first voltage. The method also includes generating a second voltage approximately equal to the first voltage divided by approximately two, minus the dynamic voltage. The method also includes generating a bias voltage. The method also includes generating a write detection voltage based on the second voltage and the first bias voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a resistive random access memory (RRAM) cell, comprising:
 a select transistor; and
 a programmable resistor, coupled to a source or a drain of the select transistor,
 wherein the programmable resistor is configured to change between a relatively high resistance and a relatively low resistance responsive to changes in a cell current through the RRAM cell, a dynamic voltage being based on the resistance of the programmable resistor of the RRAM cell; and
a write detection circuit coupled to the RRAM cell and configured to receive the dynamic voltage therefrom, the write detection circuit comprising:
 a voltage shifting circuit configured to receive the dynamic voltage and a first voltage and to provide as output a second voltage approximately equal to the first voltage divided by approximately two, minus the dynamic voltage; and
 an inverter comparator circuit comprising a master circuit and a slave circuit,
 wherein the master circuit is coupled to the voltage shifting circuit and is configured to provide as output a first bias voltage,
 wherein the slave circuit is coupled to the voltage shifting circuit and to the master circuit and is configured to provide as output a write detection voltage based on the second voltage and the first bias voltage.

2. The memory cell of claim 1, wherein the voltage shifting circuit comprises:
a first circuit configured to receive the first voltage and being coupled to a ground and being configured to output the second voltage;
an operational amplifier comprising a first input, a second input, and an output, the first input being coupled to the first circuit and configured to receive the second voltage therefrom, the operational amplifier outputting at the output a second bias voltage;
a second circuit being coupled to the second input and the output of the operational amplifier and configured to receive the second bias voltage and a reference voltage; and a third circuit being coupled to the second circuit and to the output of the operational amplifier and configured to receive the second bias voltage and the dynamic voltage and to provide as output the second voltage.

3. The memory cell of claim 2, wherein the slave circuit comprises:
a fourth circuit being coupled to the third circuit and configured to receive the second voltage therefrom, and further being coupled to the master circuit and configured to receive the first bias voltage therefrom, the fourth circuit being configured to provide as output the write detection voltage.

4. The memory cell of claim 3, wherein the master circuit comprises:
a fifth circuit being coupled to the second input of the operational amplifier and to the second circuit and to the fourth circuit and configured to output the first bias voltage to the fourth circuit.

5. The memory cell of claim 1, wherein the slave circuit comprises:
a first circuit coupled to the voltage shifting circuit and configured to receive therefrom the second voltage and to output the write detection voltage.

6. The memory cell of claim 5, wherein the master circuit comprises:
a second circuit coupled to the voltage shifting circuit and to the first circuit and to provide the first bias voltage to the first circuit.

7. The memory cell of claim 1, wherein a value of the dynamic voltage varies between approximately 0 mV and approximately 100 mV.

8. A voltage shifting circuit, comprising:
a first circuit configured to receive a first voltage and being coupled to a ground and being configured to output a second voltage;
an operational amplifier including a first input, a second input, and an output, the first input being coupled to the first circuit and configured to receive the second voltage therefrom, the operational amplifier outputting at the output a bias voltage;
a second circuit being coupled to the second input and the output of the operational amplifier and configured to receive the bias voltage and a reference voltage;
a third circuit being coupled to the second circuit and to the output of the operational amplifier and including an output node, the third circuit configured to receive the bias voltage and a dynamic voltage and to output at the output node an output voltage based on the first voltage and the dynamic voltage;
wherein the output voltage is approximately equal to the first voltage divided by approximately two, minus the dynamic voltage.

9. The voltage shifting circuit of claim 8, wherein a value of the dynamic voltage varies between approximately 0 mV and approximately the reference voltage.

10. The voltage shifting circuit of claim 9, wherein the reference voltage is equal to 100 mV or less.

11. The voltage shifting circuit of claim 9, wherein the dynamic voltage is approximately equal to a voltage based on a resistance of a programmable resistor in a resistive random access memory (RRAM) cell.

12. A method, comprising:
receiving a dynamic voltage from a resistive random access memory (RRAM) cell, the RRAM cell comprising:
a select transistor; and
a programmable resistor, coupled to a source or a drain of the select transistor,
wherein the programmable resistor is configured to change between a relatively high resistance and a relatively low resistance responsive to changes in a cell current through the RRAM cell, the dynamic voltage being based on the resistance of the programmable resistor of the RRAM cell;
receiving a first voltage;
generating a second voltage approximately equal to the first voltage divided by approximately two, minus the dynamic voltage;
generating a first bias voltage; and
generating a write detection voltage based on the second voltage and the first bias voltage.

13. The method of claim 12, wherein the second voltage is generated by a voltage shifting circuit comprising:
a first circuit configured to receive the first voltage and being coupled to a ground and being configured to output the second voltage;
an operational amplifier comprising a first input, a second input, and an output, the first input being coupled to the first circuit and configured to receive the second voltage therefrom, the operational amplifier outputting at the output a second bias voltage;
a second circuit being coupled to the second input and the output of the operational amplifier and configured to receive the second bias voltage and a reference voltage; and
a third circuit being coupled to the second circuit and to the output of the operational amplifier and configured to receive the second bias voltage and the dynamic voltage and to provide as output the second voltage.

14. The method of claim 13, wherein the write detection voltage is generated by a slave circuit comprising:
a fourth circuit being coupled to the third circuit and configured to receive the second voltage therefrom, and further being coupled to the master circuit and configured to receive the first bias voltage therefrom, the fourth circuit being configured to provide as output the write detection voltage.

15. The method of claim 14, wherein the first bias voltage is generated by a master circuit comprising:
a fifth circuit being coupled to the second input of the operational amplifier and to the second circuit and to the fourth circuit and configured to output the first bias voltage to the fourth circuit.

16. The method of claim 12, wherein the second voltage is generated by a voltage shifting circuit.

17. The method of claim 16, wherein the write detection voltage is generated by a slave circuit comprising:
a first circuit coupled to the voltage shifting circuit and configured to receive therefrom the second voltage and to output the write detection voltage.

18. The method of claim 17, wherein the first bias voltage is generated by a master circuit comprising:
a second circuit coupled to the voltage shifting circuit and to the first circuit and to provide the first bias voltage to the first circuit.

19. The method of claim 12, wherein a value of the dynamic voltage varies between approximately 0 mV and approximately 100 mV.

* * * * *